United States Patent
Krishna et al.

(10) Patent No.: US 11,552,204 B2
(45) Date of Patent: Jan. 10, 2023

(54) PHOTONIC DETECTOR COUPLED WITH A DIELECTRIC RESONATOR ANTENNA

(71) Applicants: Ohio State Innovation Foundation, Columbus, OH (US); THE REGENTS OF THE UNIVERSITY OF MICHIGAN, Ann Arbor, MI (US)

(72) Inventors: Sanjay Krishna, Columbus, OH (US); Anthony Grbic, Ann Arbor, MI (US); Christopher Ball, Columbus, OH (US); Theodore Ronningen, Columbus, OH (US); Alireza Kazemi, Columbus, OH (US); Mohammadamin Ranjbaraskari, Ann Arbor, MI (US); Qingyuan Shu, Columbus, OH (US)

(73) Assignees: Ohio State Innovation Foundation, Columbus, OH (US); THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 108 days.

(21) Appl. No.: 16/780,821

(22) Filed: Feb. 3, 2020

(65) Prior Publication Data

US 2020/0321481 A1    Oct. 8, 2020

Related U.S. Application Data

(60) Provisional application No. 62/828,608, filed on Apr. 3, 2019.

(51) Int. Cl.
*H01L 31/0232* (2014.01)
*H01P 7/10* (2006.01)
(Continued)

(52) U.S. Cl.
CPC .... *H01L 31/02327* (2013.01); *H01L 27/1443* (2013.01); *H01L 27/1446* (2013.01);
(Continued)

(58) Field of Classification Search
CPC ......... H01L 31/02327; H01L 31/03046; H01L 31/109; H01L 31/105; H01L 31/1892;
(Continued)

(56) References Cited

U.S. PATENT DOCUMENTS

2003/0015729 A1*  1/2003  Bosco ................. H01L 21/8258
                                                                257/190
2014/0159183 A1*  6/2014  Na ..................... H01L 31/035281
                                                                257/432

(Continued)

OTHER PUBLICATIONS

C. Pfeiffer and A. Grbic, "Metamaterial Huygens' surfaces: tailoring wave fronts with reflectionless sheets," Phys Rev Lett, vol. 110, No. 19, p. 197401, May 10, 2013.

(Continued)

*Primary Examiner* — Sitaramarao S Yechuri
(74) *Attorney, Agent, or Firm* — Meunier Carlin & Curfman LLC

(57) ABSTRACT

An apparatus for light detection includes a light, or photon, detector assembly and a dielectric resonator layer coupled to the detector assembly. The dielectric resonator layer is configured to receive transmission of incident light that is directed into the detector assembly by the dielectric resonator layer. The dielectric resonator layer resonates with a range of wavelengths of the incident light.

17 Claims, 25 Drawing Sheets

(51) Int. Cl.
- H01L 31/0304 (2006.01)
- H01L 31/109 (2006.01)
- H01L 27/144 (2006.01)
- H01L 31/105 (2006.01)
- H01L 31/18 (2006.01)
- H01L 31/0216 (2014.01)
- H01L 31/0224 (2006.01)

(52) U.S. Cl.
CPC .......... *H01L 31/02161* (2013.01); *H01L 31/022408* (2013.01); *H01L 31/03046* (2013.01); *H01L 31/105* (2013.01); *H01L 31/109* (2013.01); *H01L 31/1892* (2013.01); *H01P 7/10* (2013.01)

(58) Field of Classification Search
CPC ....... H01L 31/02161; H01L 31/022408; H01L 31/101; H01L 31/02325; H01L 27/1446; H01L 27/1443; H01L 27/14649; H01P 7/10; G01J 5/046; G01J 5/0837
See application file for complete search history.

(56) References Cited

U.S. PATENT DOCUMENTS

| | | | | |
|---|---|---|---|---|
| 2016/0047693 | A1* | 2/2016 | Kaufman | G01J 5/10 250/340 |
| 2017/0323922 | A1* | 11/2017 | Cao | H01L 27/14696 |
| 2018/0294309 | A1* | 10/2018 | Wei | H01L 27/14649 |
| 2019/0051770 | A1* | 2/2019 | Liu | H01L 27/1446 |
| 2020/0111929 | A1* | 4/2020 | Koyama | H01S 5/0425 |
| 2021/0020795 | A1* | 1/2021 | Herschbach | H01L 27/1446 |

OTHER PUBLICATIONS

C. Pfeiffer and A. Grbic, "Controlling Vector Bessel Beams with Metasurfaces," Physical Review Applied, vol. 2, No. 4, p. 044012, Oct. 23, 2014.

C. Pfeiffer and A. Grbic, "Planar Lens Antennas of Subwavelength Thickness: Collimating Leaky-Waves with Metasurfaces," IEEE Transactions on Antennas and Propagation, vol. 63, No. 7, pp. 3248-3253, Jul. 2015.

C. Pfeiffer, C. Zhang, V. Ray, L. Jay Guo, and A. Grbic, "Polarization rotation with ultra-thin bianisotropic metasurfaces," Optica, vol. 3, No. 4, pp. 427-432, Apr. 20, 2016 2016.

Ranjbar, Amin, and Anthony Grbic. "All-dielectric bianisotropic metasurfaces." 2017 IEEE International Symposium on Antennas and Propagation & USNC/URSI National Radio Science Meeting. IEEE, 2017.

A. Arbabi, Y. Horie, M. Bagheri, and A. Faraon, "Dielectric metasurfaces for complete control of phase and polarization with subwavelength spatial resolution and high transmission," arXiv preprint arXiv:1411. 1494, 2014.

M. Decker et al., "High-Efficiency Dielectric Huygens' Surfaces," Advanced Optical Materials, vol. 3, No. 6, pp. 813-820, Jun. 2015.

P. Moitra, Y. Yang, Z. Anderson, I. I. Kravchenko, D. P. Briggs, and J. Valentine, "Realization of an all-dielectric zero-index optical metamaterial," Nature Photonics, vol. 7, No. 10, pp. 791-795, 10//print2013.

C. Wu et al., "Silicon-based infrared metamaterials with ultra-sharp fano Yesonances," arXiv preprint arXiv: 1309.6616, 2013.

Y. Abdulraheem, I. Gordon, T. Bearda, H. Meddeb, and J. Poortmans, "Optical bandgap of ultra-thin amorphous silicon films deposited on crystalline silicon by PECVD," AIP Advances, vol. 4, No. 5, p. 057122, 2014.

J. Löffler, R. Groenen, J. Linden, M. Van de Sanden, and R. Schropp, "Amorphous silicon solar cells on natively textured ZnO grown by PECVD," Thin Solid Films, vol. 392, No. 2, pp. 315-319, 2001.

M. K. Hatalis and D. W. Greve, "Large grain poly crystalline silicon by low-temperature annealing of low-pressure chemical vapor deposited amorphous silicon films," Journal of Applied Physics, vol. 63, No. 7, pp. 2260-2266, 1988.

K. Feenstra, R. Schropp, and W. Van der Weg, "Deposition of amorphous silicon films by hot-wire chemical vapor deposition," Journal of Applied Physics, vol. 85, No. 9, pp. 6843-6852, 1999.

A. Arbabi, Y. Horie, M. Bagheri, and A. Faraon, "Dielectric metasurfaces for complete control of phase and polarization with subwavelength spatial resolution and high transmission," Nature Nanotechnology, Letter vol. 10, No. 11, pp. 937-943, Nov. 2015.

L. Dawson, "Molecular beam epitaxial growth of InAsSb alloys and superlattices," Journal of Vacuum Science & Technology B, vol. 4, No. 2, pp. 598-599, 1986.

M. Yen, B. Levine, C. Bethea, K. Choi, and A. Cho, "Molecular beam epitaxial growth and optical properties of InAs1-x Sb x in 8-12 μm wavelength range," Applied Physics Letters, vol. 50, No. 14, pp. 927-929, 1987.

Y. Lin et al., "Development of bulk InAsSb alloys and barrier heterostructures for Tong-wave infrared detectors," Journal of Electronic Materials, vol. 44, No. 10, pp. 3360-3366, 2015.

Y. Lin et al., "Transport properties of holes in bulk InAsSb and performance of barrier long-wavelength infrared detectors," Semiconductor Science and Technology, vol. 29, No. 11, p. 112002, 2014.

D. Wang et al., "Metamorphic InAsSb-based barrier photodetectors for the long wave infrared region," Applied Physics Letters, vol. 103, No. 5, p. 051120, Jul. 29, 2013 2013.

Y. Yang, I. I. Kravchenko, D. Briggs, and J. Valentine, "Dielectric metasurface analogue of electromagnetically induced transparency," in CLEO: QELS_Fundamental Science, 2015, p. FW4C. 7: Optical Society of America.

M. Zamiri et al., "Antimonide-based membranes synthesis integration and strain engineering," Proceedings of the National Academy of Sciences, p. 201615645, 2016.

M. Zamiri et al., "Indium-bump-free antimonide superlattice membrane detectors on silicon substrates," Applied Physics Letters, vol. 108, No. 9, p. 091110, 2016.

C. Mittag et al., "Passivation of Edge States in Etched InAs Sidewalls," arXiv preprint arXiv: 1706.01704, 2017.

H. Kazemi et al., "First THz and IR characterization of nanometer-scaled antenna-coupled InGaAs/InP Schottky-diode detectors for room temperature infrared imaging—art. No. 65421J," Infrared Technology and Applications XXXIII, vol. 6542, pp. J5421-J5421, 2007.

A. P. Craig, M. D. Thompson, Z. B. Tian, S. Krishna, A. Krier, and A. R. J. Marshall, "InAsSb-basednBnphotodetectors: lattice mismatched growth on GaAs and low-frequency noise performance," Semiconductor Science and Technology, vol. 30, No. 10, p. 105011, Oct. 2015.

A. P. Craig, A. R. J. Marshall, Z. B. Tian, and S. Krishna, "Mid-infrared InAsSb-based nBn photodetectors with AlGaAsSb barrier layers—Grown on GaAs, using an interfacial misfit array, and on native GaSb," Infrared Physics & Technology, vol. 67, pp. 210-213, Nov. 2014.

Z. B. Tian, R. T. Hinkey, S. Krishna, and E. A. Plis, "Influence of composition in InAs/GaSb type-II superlattices on their optical properties," Electronics Letters, vol. 50, No. 23, pp. 1733-1734, Nov. 6, 2014.

VIGO MCT Infrared Detector Description & Specifications. Sep. 9, 2017. Available: https://www.vigo.com.pl/products/infrared-detectors.

J. A. Bean, A. Weeks, and G. D. Boreman, "Performance Optimization of Antenna-Coupled Al/AlOx/PtTunnel Diode Infrared Detectors," IEEE Journal of Quantum Electronics, vol. 47, No. 1, pp. 126-135, Jan. 2011.

L. Kwok Wa, L. Eng Hock, and F. Xiao Sheng, "Dielectric Resonator Antennas From the Basic to the Aesthetic," Proceedings of the IEEE, vol. 100, No. 7, pp. 2181-2193, 2012.

A. Petosa and A. Ittipiboon, "Dielectric resonator antennas: A historical review and the current state of the art," IEEE Antennas and Propagation Magazine, vol. 52, No. 5, pp. 91-116, 2010.

(56) References Cited

OTHER PUBLICATIONS

W. Q. Wu, H. L. Feng, H. S. Rao, Y. F. Xu, D. B. Kuang, and C. Y. Su, "Maximizing omnidirectional light harvesting in metal oxide hyperbranched array architectures," Nature Communications, vol. 5, p. 3968, May 29, 2014.
Zou, Longfang, et al. "Dielectric resonator nanoantennas at visible frequencies." Optics express 21.1 (2013): 1344-1352.
Schwarz, S. E., and B. T. Ulrich. "Antenna-coupled infrared detectors." Journal of Applied Physics 48.5 (1977): 1870-1873.
Kroemer, Herbert. "The 6.1 A family (InAs, GaSb, AlSb) and its heterostructures: a selective review." Physica E: Low-dimensional Systems and Nanostructures 20.3-4 (2004): 196-203.
Rodriguez, Jean-Baptiste, et al. "n B n structure based on In As/Ga Sb type-II strained layer superlattices." Applied Physics Letters 91.4 (2007): 043514.
Kim, H. S., et al. "Mid-IR focal plane array based on type-II In As/ Ga Sb strain layer superlattice detector with n B n design." Applied Physics Letters 92.18 (2008): 183502.
Svensson, S. P., et al. "Band gap of InAs 1-x Sb x with native lattice constant." Physical Review B 86.24 (2012): 245205.
Sarney, W. L., et al. "Bulk InAsSb with 0.1 eV bandgap on GaAs." Journal of Applied Physics 122.2 (2017): 025705.
Dahiya, Vinita, et al. "Investigation of digital alloyed AlInSb metamorphic buffers." Journal of Vacuum Science & Technology B, Nanotechnology and Microelectronics: Materials, Processing, Measurement, and Phenomena 36.2 (2018):02D111.
S. Long, M. McAllister, M. and L. Shen, The resonant cylindrical dielectric cavity antenna. IEEE Trans. on Antennas and Propagation, 31(3), pp. 406-412, 1983.
J. A. Montoya, Z. B. Tian, S. Krishna, S. and W. J. Padilla, "Ultra-thin infrared metamaterial detector for multicolor imaging applications," Optics Express, 25(19), pp. 23343-23355, 2017.
S. Wang, N. Yoon, A. Kamboj, P. Petluru, W. Zheng, and D. Wasserman, "Ultra-thin enhanced-absorption long-wave infrared detectors," Applied Physics Letters, 112(9), p. 091104, 2018.
M. Khorasaninejad, W. Chen, R. Devlin, J. Oh, A. Zhu and F. Capasso, Science, vol. 352, No. 6290, pp. 1190-1194, 2016.

Wu, Chihhui, et al. "Spectrally selective chiral silicon metasurfaces based on infrared Fano resonances." Nature communications 5.1 3892, (2014): 1-9.
Odit, Mikhail, et al. "Experimental realisation of all-dielectric bianisotropic metasurfaces." Applied Physics Letters 108.22 (2016): 221903.
Kim, Minseok, and George V. Eleftheriades. "Highly efficient all-dielectric optical tensor impedance metasurfaces for chiral polarization control." Optics letters 41.20 (2016): 4831-4834.
Jiang, Huan, Wenyu Zhao, and Yongyuan Jiang. "High-efficiency tunable circular asymmetric transmission using dielectric metasurface integrated with graphene sheet." Optics express 25.17 (2017): 19732-19739.
A. Ranjbarand A. Grbic, IEEE Internat. Symp. on Antennas and Propagation, pp. 1-2, Fajardo, Puerto Rico, Jun.-Jul. 2016.
Ranjbar, Amin, and Anthony Grbic. "Analysis and synthesis of cascaded metasurfaces using wave matrices." Physical Review B 95.20 (2017): 205114.
A. Ranjbarand A. Grbic, IEEE Internat.Symp. on Antennas and Propagation, pp. 1-2, Boston MA, Jul. 8-13, 2018.
A. Ranjbar, A. Grbic, "Broadband, Multiband, and Multifunctional All-Dielectric Metasurfaces," Physical Review Applied 11, 054066 (2019).
A. Ranjbar, A. Grbic, "Experimental demonstration of cascaded all-dielectric metasurfaces," submitted Oct. 2018.
S. Zhang, A. Soibel, S. A. Keo, D. Wilson, S. B. Rafol, D. Z. Ting, A. She, S. D. Gunapala, F., "Solid-immersion metalensesfor infrared focal plane arrays," Applied Physics Letters,! 13(11), p. 111104, 2018.
O. Akin, O. H. V. Demir, High-efficiency low-crosstalk dielectric metasurfacesof mid-wave infrared focal plane arrays.Applied Physics Letters,110(14), p. 143106, 2017.
Zhu, J. and Eleftheriades, G.V., "A simple approach for reducing mutual coupling in two closely spaced metamaterial-inspired monopole antennas," IEEE Antennas and Wireless Propagation Letters, 9, pp. 379-382, 2010.
Driggers, Ronald G., et al. "Infrared detector size: how low should you go?" Optical Engineering 51.6 (2012): 063202.

* cited by examiner

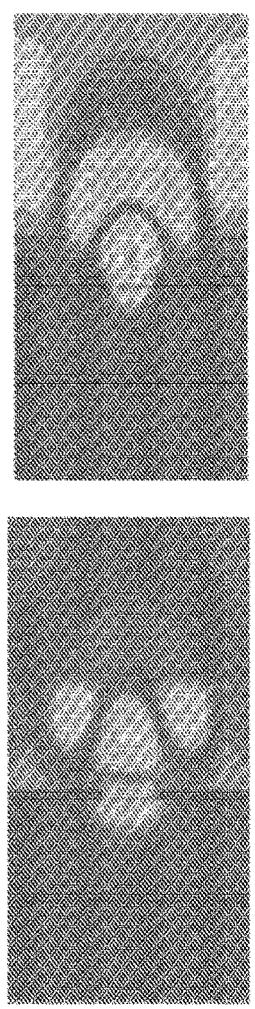
FIG. 22A
FIG. 22B
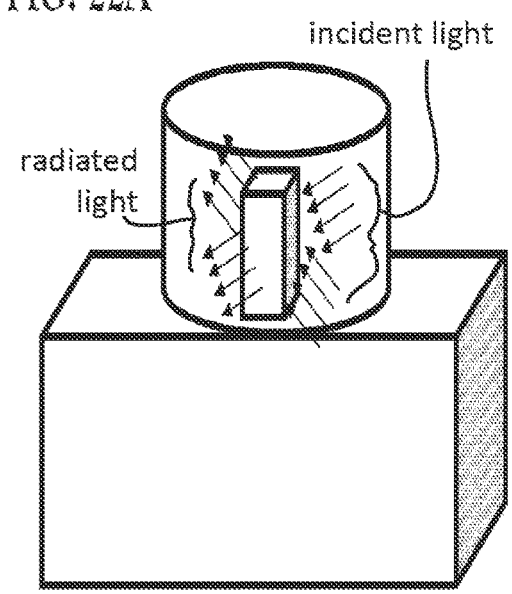
FIG. 22C
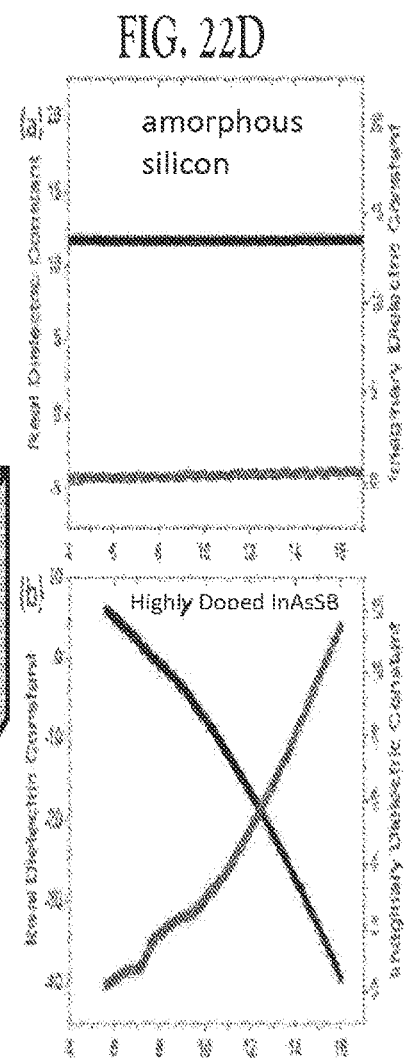
FIG. 22D
FIG. 22E

PHOTONIC DETECTOR COUPLED WITH A DIELECTRIC RESONATOR ANTENNA

CROSS REFERENCE TO RELATED APPLICATIONS

This application claims priority to, and the benefit of, U.S. Provisional Patent Application Ser. No. 62/828,608 filed on Apr. 3, 2019, which is incorporated by reference as if set forth fully herein.

STATEMENT REGARDING FEDERALLY SPONSORED RESEARCH

This invention was made with government support under government contract number NRO/Grant No. NR0000-18-C-0101 awarded by the National Reconnaissance Office The government has certain rights in the invention.

BACKGROUND

Traditional detectors of infrared light have faced significant drawbacks in terms of size, thermal noise, and coupling efficiencies. Metal coupled antenna structures suffer significant signal loss because metals are lossy at long infrared wavelengths, and in many cases the antenna efficiency of prior art models, as shown in FIG. 1 is less than 50 percent. These problems require additional work to achieve proper signal to noise ratios and infrared wavelength detection efficiencies. For example, issues regarding impedance matching and the like are problematic in the prior art.

Dielectric resonator antennas are all-dielectric antennas. A dielectric such as silicon exhibits very low loss in a long wave infrared (LWIR) detector, so the efficiencies in silicon dielectric antennas have been promising. Generally, the contrast in dielectric constant between the antenna and surrounding medium sets up a standing wave (mode) within the antenna that radiates. Displacement currents in dielectric resonator antennas take the place of conduction currents in conventional metallic antennas. The result is that quantum efficiencies in dielectric antennas are high.

Coupling of metallic antennas to LWIR detectors has also led to poor coupling efficiencies. The proposed approach uses a dielectric, resonator antenna (micro-disk) that is impedance matched to the photon detector. Signal is improved by this improved coupling, and high temperature noise is decreased by shrinking the detection volume, leading to an overall improvement in signal-to-noise ratio and detectivity. Broad bandwidth noise can be further reduced by designing the antenna to be resonant over a narrow bandwidth. The design can be optimized by adjusting the resonator structure, resonator material, and placement of the detector within the structure. In one non-limiting example, fabrication will involve processing of antimonide detectors and coupling to the antenna.

Even in light of these developments, a need continues to exist in the art of long wavelength infrared (LWIR) detectors that:
  Remove the need for cryogenic cooling of LWIR detectors;
  Achieve performance characteristics (detectivity and spectral range) as good as or better than cooled mercury cadmium telluride (MCT) detectors of the prior art;
  Demonstrate a path toward LWIR focal plane arrays (FPAs);
  Reduce the cost and schedule risk associated with manufacturing LWIR detectors and FPAs. These goals are addressed further below.

SUMMARY

In a broad embodiment, an apparatus for light detection includes a light, or photon, detector assembly and a dielectric resonator layer coupled to the detector assembly. The dielectric resonator layer is configured to receive transmission of incident light that is directed into the detector assembly by the dielectric resonator layer. The dielectric resonator layer resonates with a range of wavelengths of the incident light.

BRIEF DESCRIPTION OF THE DRAWINGS

The accompanying drawings, which are incorporated and constitute a part of this specification, illustrate several aspects of the disclosure, and together with the description, serve to explain the principles of the disclosure.

FIG. 22A is a schematic diagram of magnetic field intensity of a long wave infrared detector assembled according to concepts of this disclosure.

FIG. 22B is a schematic diagram of electric field intensity of a long wave infrared detector assembled according to concepts of this disclosure.

FIG. 22C is a schematic diagram of capacitive and inductive fields present in a long wave infrared detector as set forth herein.

FIG. 22D is a first plot estimating dielectric constant of a dielectric resonant antenna according to at least one embodiment of this disclosure.

FIG. 22E is a second plot estimating dielectric constant of a detector assembly coupled to a dielectric resonant antenna according to at least one embodiment of this disclosure.

DETAILED DESCRIPTION

Figure 1:
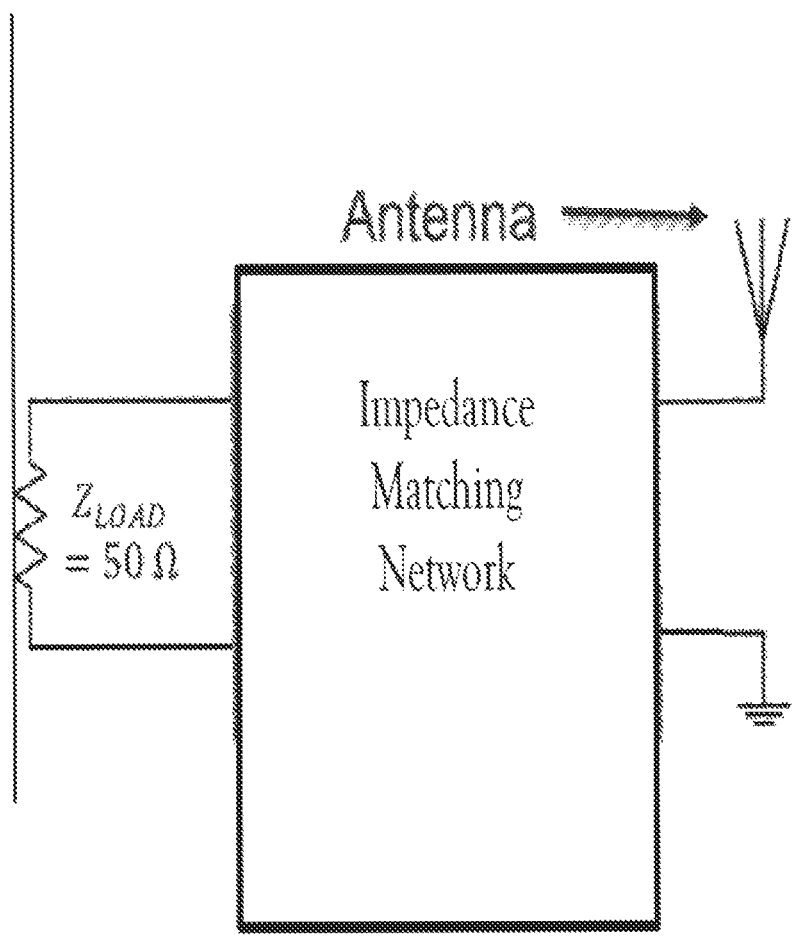
FIG. 1 is a PRIOR ART schematic representation of a previously used long wave infrared detector as described in the background of this disclosure.
Figure 2A:
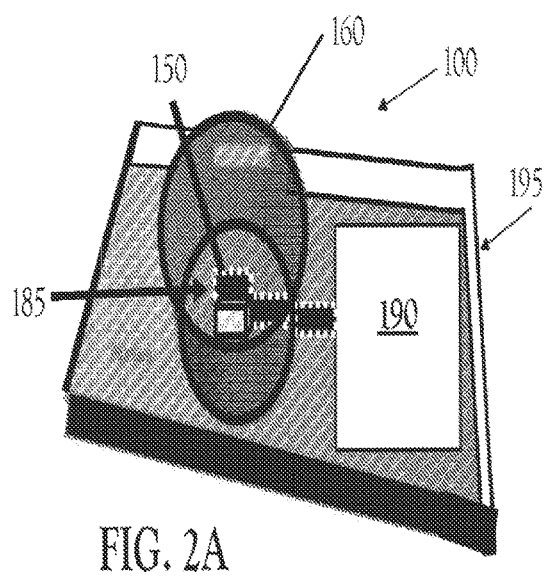
FIG. 2A is a perspective view of a schematic representation of a dielectric resonator antenna coupled to a photonic detector as described herein.
Figure 2C:
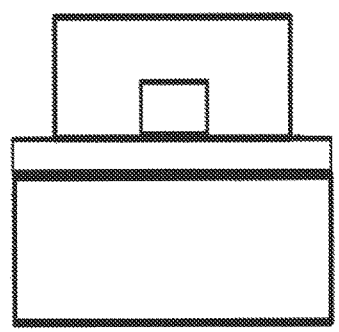
FIG. 2C is a second side view of a schematic representation of a dielectric resonator antenna coupled to a photonic detector as described herein.
Figure 2B:
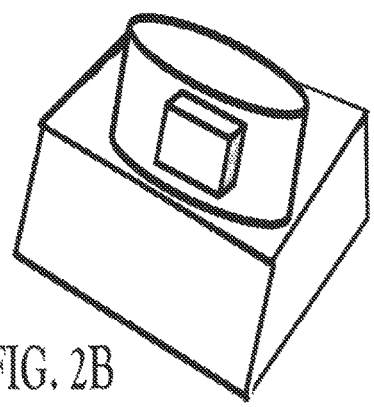
FIG. 2B is a first side view of a schematic representation of a dielectric resonator antenna coupled to a photonic detector as described herein.
Figure 2D:
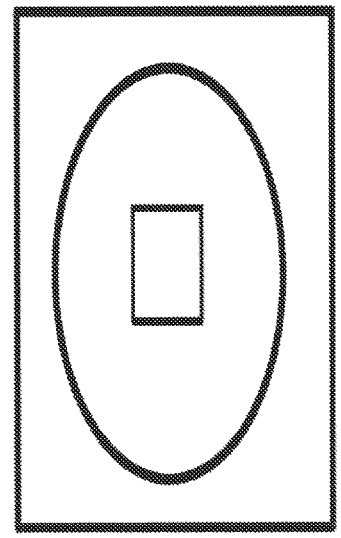
FIG. 2D is a top view of a schematic representation of a dielectric resonator antenna coupled to a photonic detector as described herein.

The devices and methods described herein may be understood more readily by reference to the following detailed description of specific aspects of the disclosed subject matter and the Examples included therein.

Before the present devices and methods are disclosed and described, it is to be understood that the aspects described below are not limited to the details of construction and arrangement of components set forth in the following description or illustrated in the drawings. The disclosed technology is capable of other embodiments and of being practiced or carried out in various ways.

In the following description, references are made to the accompanying drawings that form a part hereof and that show, by way of illustration, specific embodiments or examples.

It is also to be understood that the terminology used herein is for the purpose of describing particular aspects only and is not intended to be limiting. In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

The specification makes references to numerous electrical charges of opposite polarity along with collection of certain positive and negative charges on identified hardware. Nothing in this specification limits the disclosure to any one arrangement of positive or negative polarity in circumstances where an opposite polarity may also be arranged.

Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

This disclosure references electronic device structures in terms of "layers." The term layer is merely descriptive and generally refers any section of the device that has been identified and referenced for a particular part of the disclosure. The term layer is intended to include its broadest possible interpretation and is not limited to any particular shape, size, boundary, delineation, composition or composition change. The scope of the term layer is to be determined by the context of its use herein. Terms such as barrier layer and channel layer are merely descriptive and may or may not have different compositions. A channel layer can be any referenced section or region of an electronic device that conducts a controlled current, typically from source to drain or cathode to anode in any direction. Barrier layers may include any sections of a device that are described by their positions relative to a channel conducting a controlled or desirable current in the device. The barrier layers may also refer to sections of a device that withstand applied voltage conditions without conducting current. In some non-limiting embodiments, a barrier layer may refer to passivation layers described and used herein according to the standard usage in the art of layered electronic devices, including but not limited to passivation layers that provide a desirable electrical, chemical, or physical response on a surface or within a section of an electronic apparatus.

The electronic structures in this case include descriptions of terminals and contacts, including but not limited to anodes, cathodes, gates, drains, sources, and the like. These terms are intended to refer to their broadest possible meanings in accordance with similar structures as commonly used in the art of electronics. The kinds of materials used to form the terminals and contacts are intentionally broad and encompass all present and future materials, positions, doping levels, and other characteristics of terminals and contacts, so long as the technology fits within a given use as discussed herein.

Terms of art are used in this disclosure and shall be given their broadest meaning. For example, a high electron mobility material encompasses all compositions for which the art of electronics typically describes as having a high electron mobility, including but not limited to Group III-V semiconductor compositions with or without additional doping.

This disclosure discusses characteristics of materials in terms of a respective dielectric constant and/or a dielectric permittivity. These terms are used in accordance with standard industry practices in physics and electronics to discuss properties determining how much electrostatic energy, i.e., charge, can be stored per unit of volume in a material subject to a corresponding applied unit voltage. Traditionally, dielectric constants correspond to a relative dielectric permittivity $\varepsilon_r$, and relative permittivity is defined as the permittivity of a given material relative to that of the permittivity of a vacuum. The term "permittivity" herein is generally relative permittivity given the context. Absolute permittivity $\varepsilon_0$ is defined as the measure of permittivity for a material in a vacuum and it is how much resistance is encountered when forming an electric field in the vacuum.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

As used herein, the term "adjacent" means an element extends near another element and includes closely spaced apart from, touching and/or overlapping the other element. In contrast, when an element is described as extending "to" or "from" another element, it means the element actually touches or overlaps with the other element, and excludes the elements being spaced apart from one another.

As is known to those of skill in the art, doped and undoped regions of semiconductors may be formed through epitaxial growth and/or through implantation. For example, a p-type region of a semiconductor may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial layer/region" and "implanted layer/region" structurally distinguish differing layers/regions of silicon carbide and may be used herein as a recitation of structural characteristics of the layer/regions of silicon carbide and/or as recitations of methods of forming such layers/regions of silicon carbide.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification, and will not be interpreted in an idealized or overly formal sense unless expressly so defined herein.

The three important characteristics of photon detectors 150, i.e., photon detector elements or photon detector membranes are signal, noise and speed. These photon detectors 150 may also be referred to as detector assemblies 150 herein. There are inherent trade-offs in these three figures of merit and various applications emphasize one or more characteristics. The proposed disclosure aims to break this trade off using a small "subwavelength" detector 150 in all three dimensions to achieve low noise coupled with an antenna that can enhance the signal. This design can be used to optimize the signal, noise and speed for a given application with constraints placed on the operating wavelength, temperature, spectral and frequency bandwidth and cost.

The improved elements of the disclosure include the design, choice of materials and geometry that govern the architecture of the device.

One non-limiting, preferred embodiment combines a dielectric resonator antenna (DRA), also referred to as a dielectric resonator layer 160, with a semiconductor light absorber serving as the photonic detector element 150. An initial implementation of an overall long wave infrared (LWIR) detector 100 consists of (1) an InAsSb absorber element (i.e., a photon detector element 150), one that is several times smaller than the wavelength of the infrared light, embedded in (2) a resonant, cylindrical DRA 160 made of amorphous silicon. This architecture enables element (1), the photonic detector 150, to shrink to deep subwavelength dimensions, thereby reducing its thermal noise. However, element (2), the dielectric resonator antenna 160 remains relatively large (comparable to the detected wavelength), is low loss, and is resonant with the target infrared wavelength of incident light to enhance the collection of infrared light. The dielectric resonator antenna layer 160 is designed using full wave electromagnetic simulation tools to excite a magnetic resonance, enhancing the field at the photo detector element 150 and promoting radiation coupling to the photon detector element. In some embodiments, both elements may be placed on a "ground plane" 175 to further enhance the field at the photonic detector element 150. The model predicts that this structure of a LWIR detector 100 will enhance the fraction of light absorbed by the photonic detector element 150 from less than 3%, on its own, to more than 60% when embedded in a dielectric resonator antenna 160 structure, or dielectric resonant antenna layer 160.

One initial implementation of this overall LWIR detector 100 is called a dielectric resonator antenna coupled antimonide detector (DRACAD). The acronym DRACAD as used in this disclosure is not limiting of the materials that may be used for the photonic detector surrounded or coupled to a dielectric resonant antenna. The acronym DRACAD is used only as one example embodiment of the concepts herein using an example antimonide detector assembly.

The DRACAD and the predictions for its improved absorption properties are shown in the figures of this disclosure. The DRA in this case is designed to be resonant with infrared light at 9 μm wavelength. The geometry of the DRA can be adjusted to be resonant with other wavelengths as well. Using this feature, the DRACAD can be optimized for a target wavelength across the infrared spectrum. In addition, some geometries can "broaden" the resonance enabling the DRACAD to absorber a wider range of wavelengths.

The disclosed LWIR detector 100 has the potential to improve infrared detection and imaging. One of the primary limitations for infrared detectors and imagers is the signal to noise that can be achieved. The LWIR detector 100 of this disclosure enables an improvement in the signal to noise by reducing the noise contribution while enhancing the signal detection. The approach can be extended to cover the infrared spectrum. It can also be applied to an array of LWIR detectors that will be used to form an imager. Infrared detection and imaging is used in medicine, industrial process monitoring, quality control, environmental monitoring, thermal imaging, and defense and security applications.

The disclosed long-wave infrared (LWIR) detector 100, having both the DRA 160 and an internal photonic dectector element 150, can measure photons with greater sensitivity, and at a higher operating temperature, than state-of-the art mercury cadmium telluride (MCT) detectors. The proposed dielectric resonator antenna coupled antimonide detector 100 combines a dielectric, resonant antenna (DRA) 160 with an antimonide based membrane photonic detector element or photonic detector assembly 150. This architecture enables the photon detection element to shrink, to deep subwavelength dimensions, reducing its thermal noise. The DRA, however, remains relatively large, maintaining a wavelength-size optical collection area. The DRA also enhances the collection of photons with a resonant structure. These combined effects will reduce noise and increase signal, enabling room temperature operation with state-of-the-art detectivity.

Resonator Design. This disclosure shows how the LWIR detector leverages foundational work on electromagnetic meta-surfaces [1-4]. Recent work on the synthesis of all-dielectric meta-surfaces [5] is of particular relevance to this disclosure. Dielectric meta-surfaces, consisting of dielectric resonators and subwavelength gratings, have demonstrated unprecedented polarization control across extremely short length scales. Transmissive and reflective dielectric meta-surfaces have been developed to realize extreme wavefront manipulation and compact optical elements [6-9]. One non-limiting concept in this work is to design an absorptive dielectric meta-surface that directs optical power into a membrane detector, or photonic detector, embedded within a DRA. Without limiting the disclosure to any one embodiment, and for example only, the preliminary DRACAD design uses a cylindrical DRA, with a detector embedded within it, atop a ground plane.

The response of the preliminary DRA design to LWIR radiation is shown in the figures. The cylindrically symmetric shape of the amorphous silicon (α-Si) DRA allows the detector to respond to both transverse magnetic (TM) and transverse electric (TE) polarizations. The DRA and photonic detector are placed directly on the ground plane. The high dielectric contrast between α-Si and air (as well as α-Si and metal) is needed for the DRA to function as a radiating cavity. Further, the DRA radiates as a magnetic dipole that is tangential to the ground plane. As a result, the ground plane enhances the DRA radiation characteristics and allows for efficient coupling between the DRACAD and free space.

Resonator Fabrication. The DRA can be grown using a chemical vapor deposition (CVD) technique to cover a surface, and the detector elements, with α-Si. To date, and without limiting this disclosure, the best quality α-Si are made with CVD technologies such as plasma enhanced chemical vapor deposition (PECVD) [10, 11], low-pressure chemical vapor deposition (LPCVD) [12] and catalytic chemical vapor deposition (Cat-CVD) [13]. The thermal budget of the CVD process (as low as 200° C. [14]) is compatible with the antimonide detectors.

The deposited α-Si will then be polished, patterned and etched. The polishing to sub-micron dimensions reduces scattering. The patterning and etching will create the DRA structure. The etching mask position must be controlled to ensure the detector element falls at the designed position within the DRA.

Detector Design and Growth. The fabrication of a DRACAD begins with the epitaxial growth and patterning of the detection elements. For the proposed effort, the detection elements will be InAsSb alloys. Bulk InAsSb alloys are a promising III-V material system for LWIR detectors [15, 16]. This material system offers advantages over other material systems, including Type II strained-layer superlattices (T2SL), due to the large density of states that increases the absorption coefficient and improves carrier transport, due to the long minority carrier lifetimes and high mobilities [17]. Various groups have optimized the InAsSb-based barrier design for LWIR [16-20]. The bandgap of InAsSb can be tuned across the LWIR by varying the Sb composition.

Growth and fabrication steps for the DRACAD. The detector structure must be selected to balance the reduction of noise with other performance characteristics. InAsSb alloy detectors have already been incorporated into detector structures that suppress detector dark current [19]. An nBn structure uses a unipolar barrier layer (B), between the absorber and top contact layer, to block the flow of electrons and allow the flow of photo-generated holes. The barrier also assists in suppressing the flow of accumulated electrons at the surface.

Figure 3A:
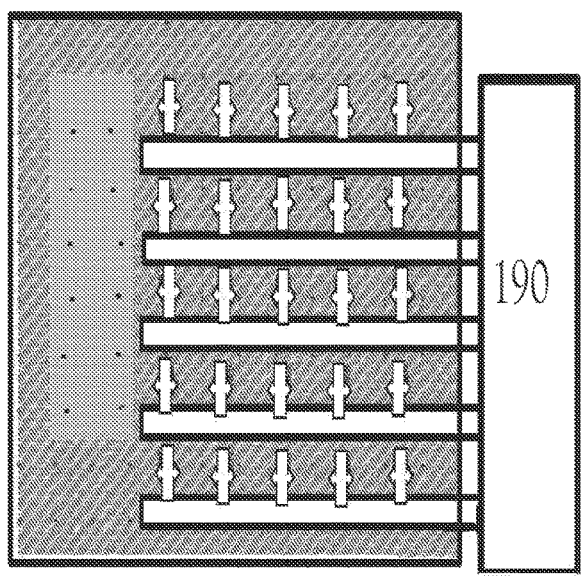
FIG. 3A is a top view of a schematic representation of an array of respective photonic detectors with metallization contacts as described herein.
Figure 3B:
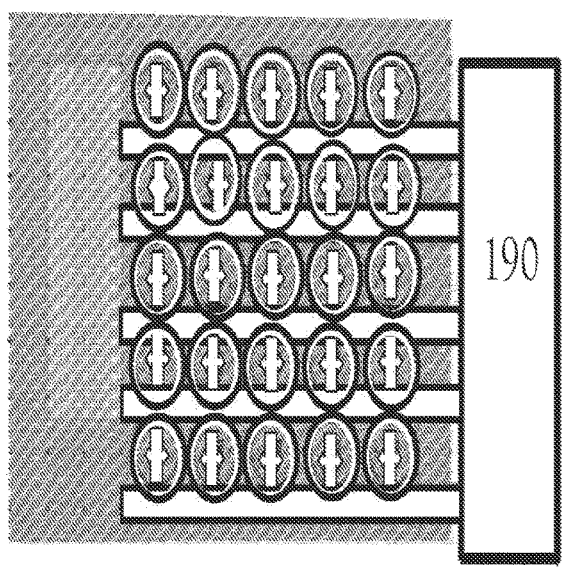
FIG. 3B is a top view of a schematic representation of an array of dielectric resonator antennas coupled to respective photonic detectors forming an antenna pattern as described herein
Figure 4A:
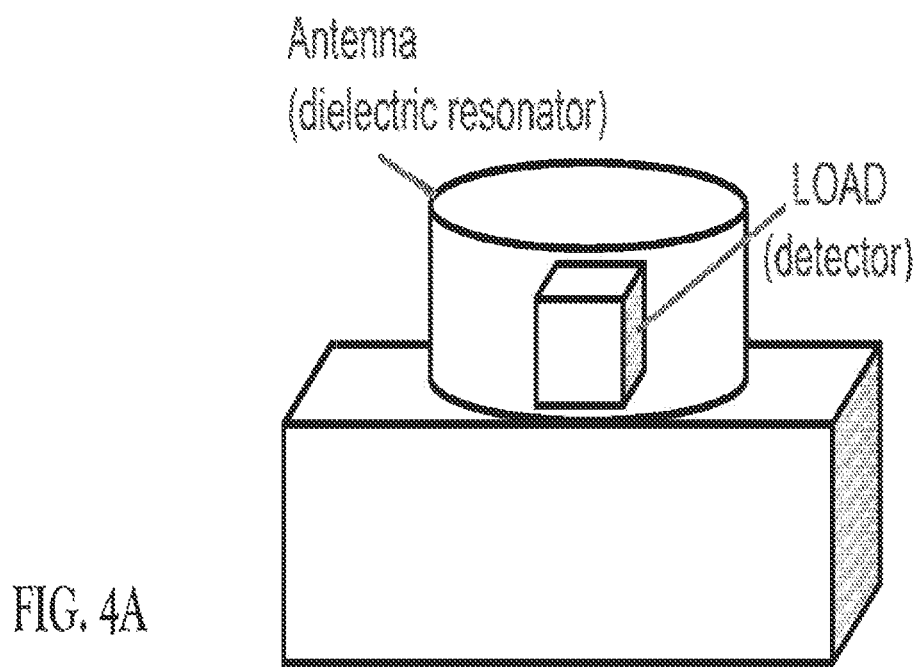
FIG. 4A is a schematic view of a dielectric resonator antenna coupled to a photonic detector as a load as described herein.
Figure 4B:
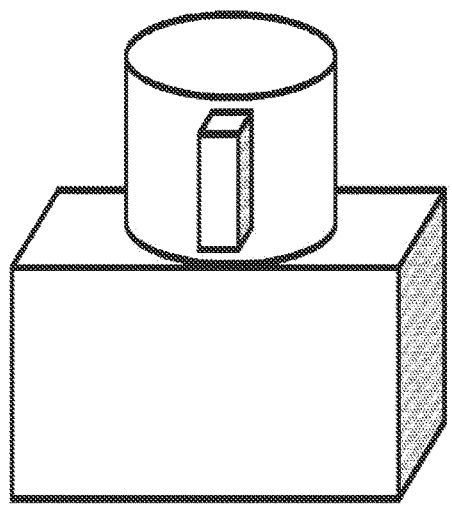
FIG. 4B is a schematic representation of a dielectric resonator antenna coupled to a photonic detector to form a long wave infrared detector element surrounded by a cylindrical, amorphous silicon DRA.
Figure 5:
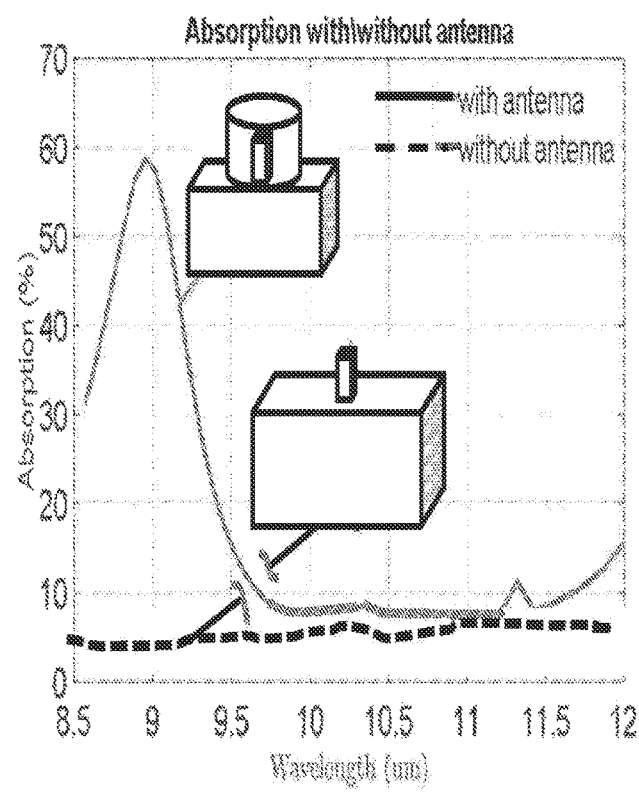
FIG. 5 is a comparative plot of photon absorption for a series of wavelengths for a dielectric resonator antenna coupled to a photonic detector and a photonic detector without the dielectric resonator antenna.
Figure 6:
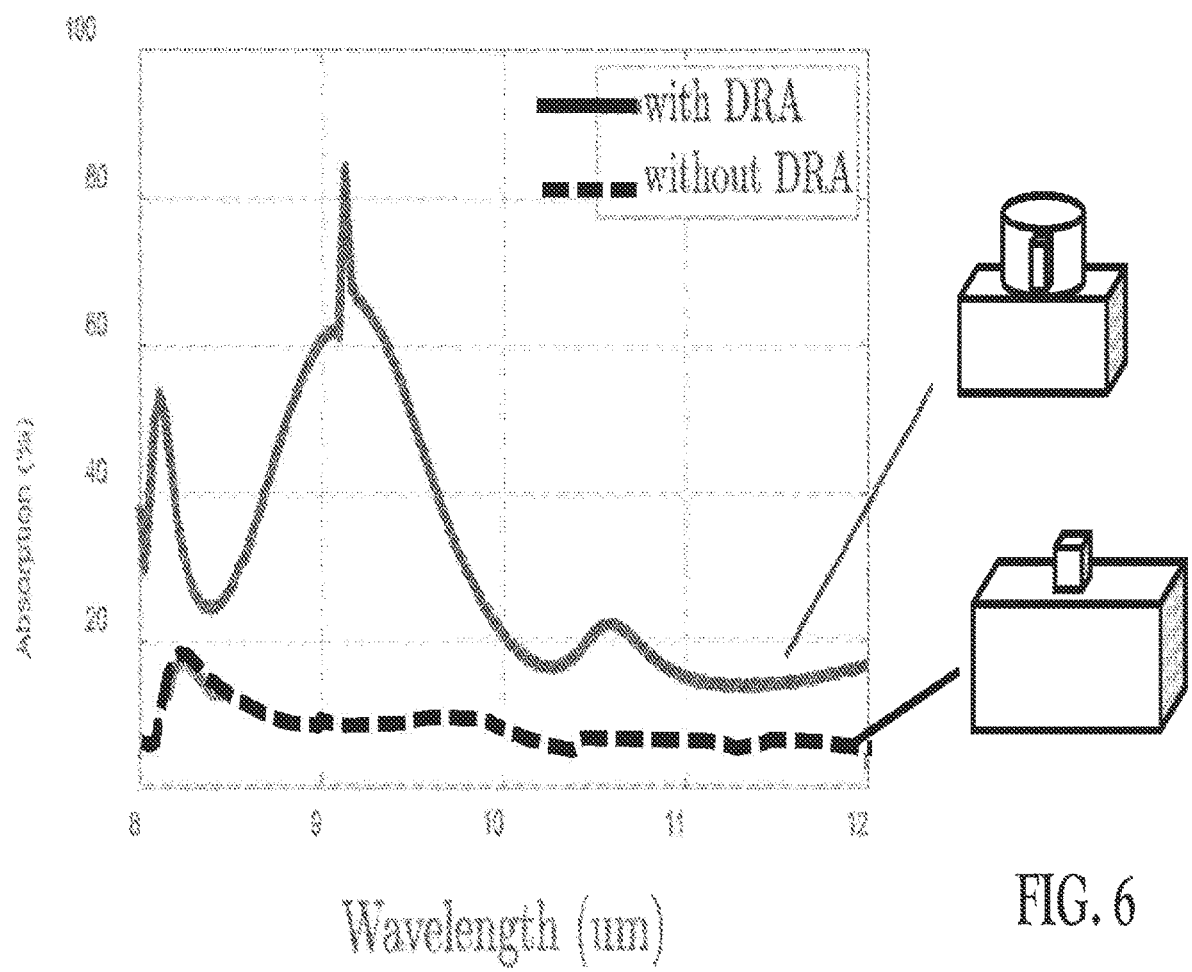
FIG. 6 is a comparative plot of photon absorption for a series of wavelengths for a dielectric resonator antenna coupled to a photonic detector and a photonic detector without the dielectric resonator antenna.
Figure 7A:
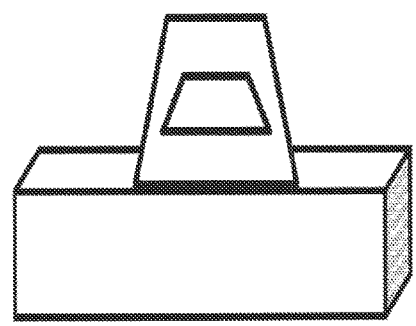
FIG. 7A is a schematic representation of a photonic detector with a dielectric resonator antenna having a pyramidal top region as disclosed herein.
Figure 7B:
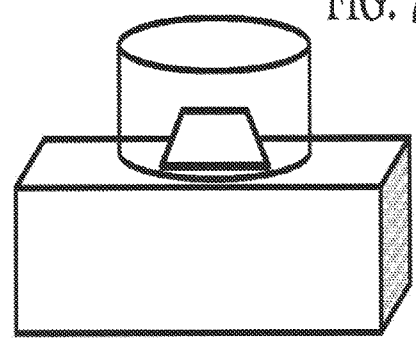
FIG. 7B is a schematic representation of a photonic detector with a cylindrical dielectric resonator antenna coupled thereto as disclosed herein.
Figure 7C:
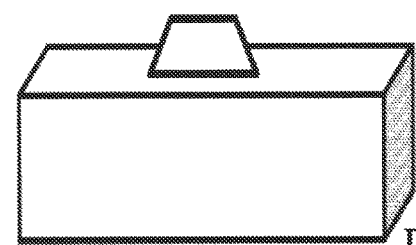
FIG. 7C is a schematic representation of a photonic detector without a coupled dielectric resonator antenna as disclosed herein.
Figure 7D:
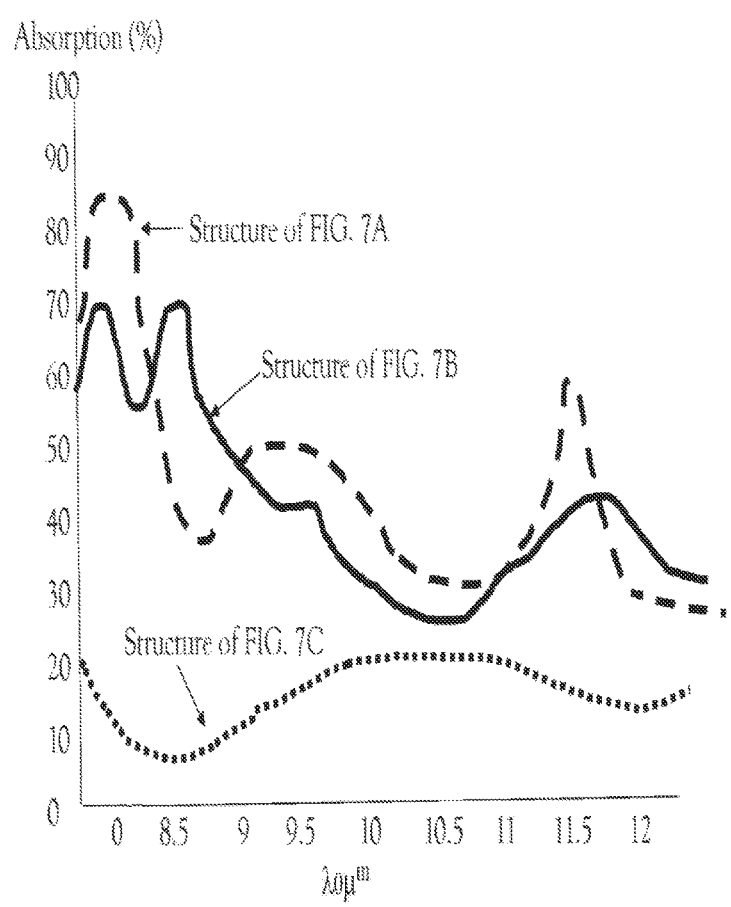
FIG. 7D is a comparative plot of absorption for a series of wavelengths for the assemblies of FIGS. 7A, 7B, and 7C.
Figure 8A:
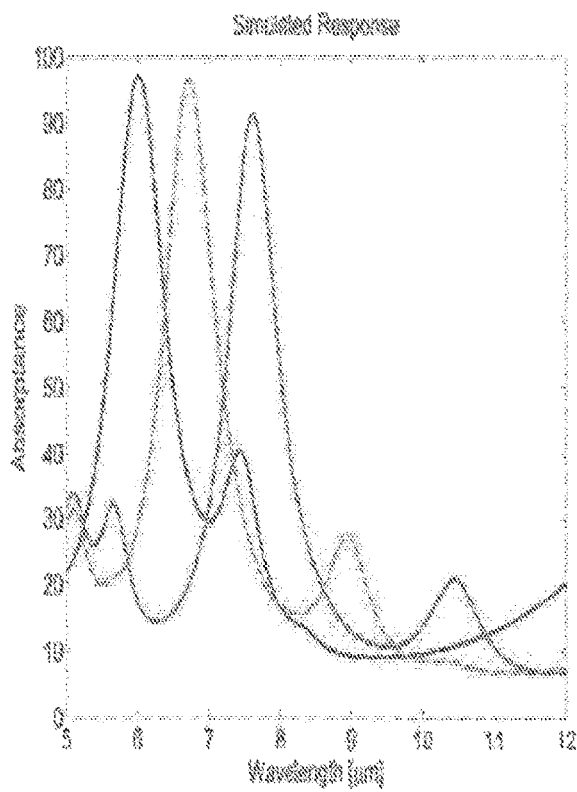
FIG. 8A is a plot of simulated absorption responses for a series of ultrathin absorber detectors as discussed herein.
Figure 8B:
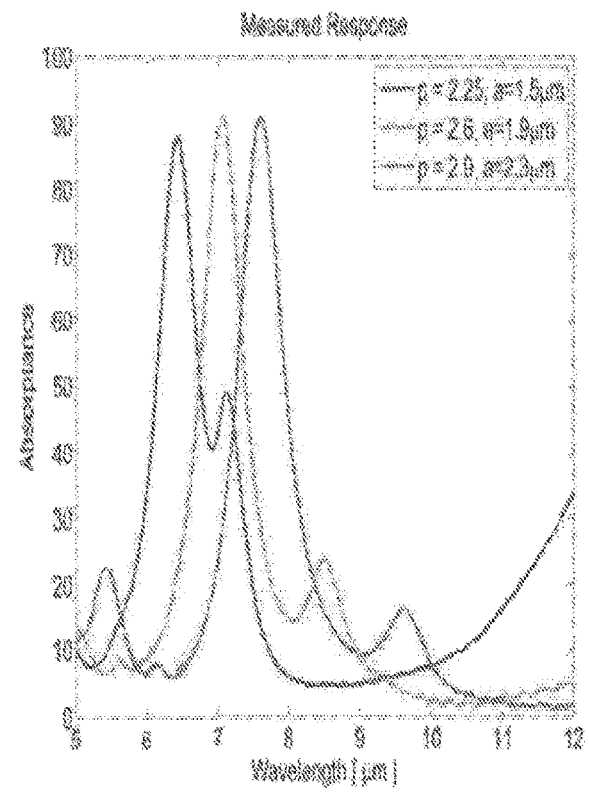
FIG. 8B is a plot of measured absorption responses for the series of ultrathin absorber detectors as discussed herein.
Figure 9A:
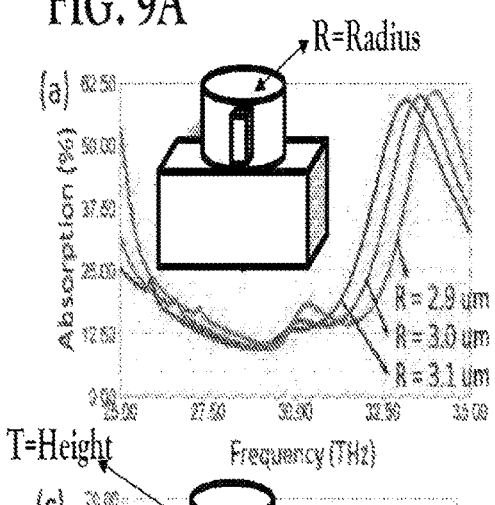
FIG. 9A is a comparative plot of absorption percentages for a series of incident light frequencies for the respective assemblies having dielectric resonant antennas of radius R.
Figure 9B:
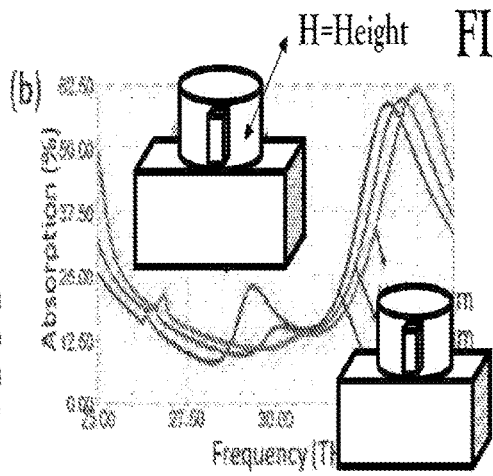
FIG. 9B is a comparative plot of absorption percentages for a series of incident light frequencies for the respective assemblies having dielectric resonant antennas of height H.
Figure 9C:
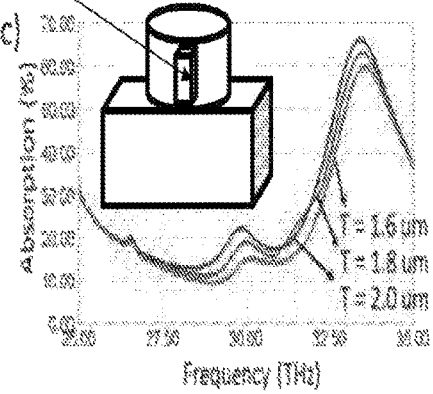
FIG. 9C is a comparative plot of absorption percentages for a series of incident light frequencies for the respective assemblies having detectors of height T.
Figure 9D:
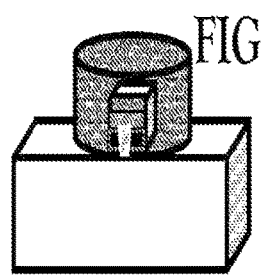
FIG. 9D is a schematic plot of the volume loss density distribution showing that most of the power is absorbed within the detector near the ground plane
Figure 9E:
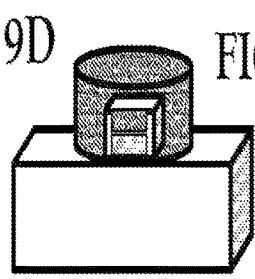
FIG. 9E is a schematic plot of the volume loss density distribution showing that most of the power is absorbed within the detector near the ground plane
Figure 9F:
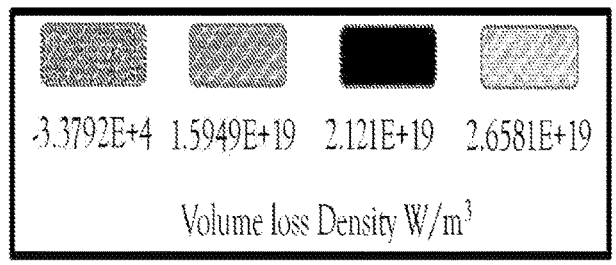
FIG. 9F is a schematic legend of volume loss density distribution of the plots of FIG. 9D and FIG. 9E.
Figure 10A:
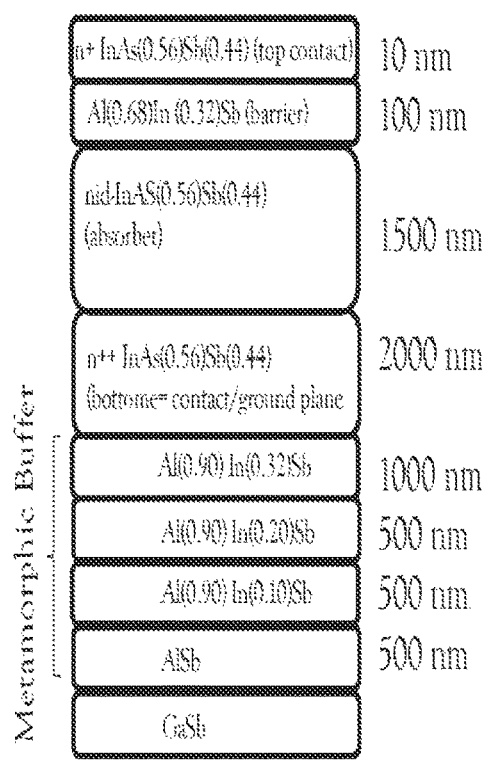
FIG. 10A is a schematic diagram of an $InAs_{56}Sb_{44}$ detector as described herein.
Figure 10B:
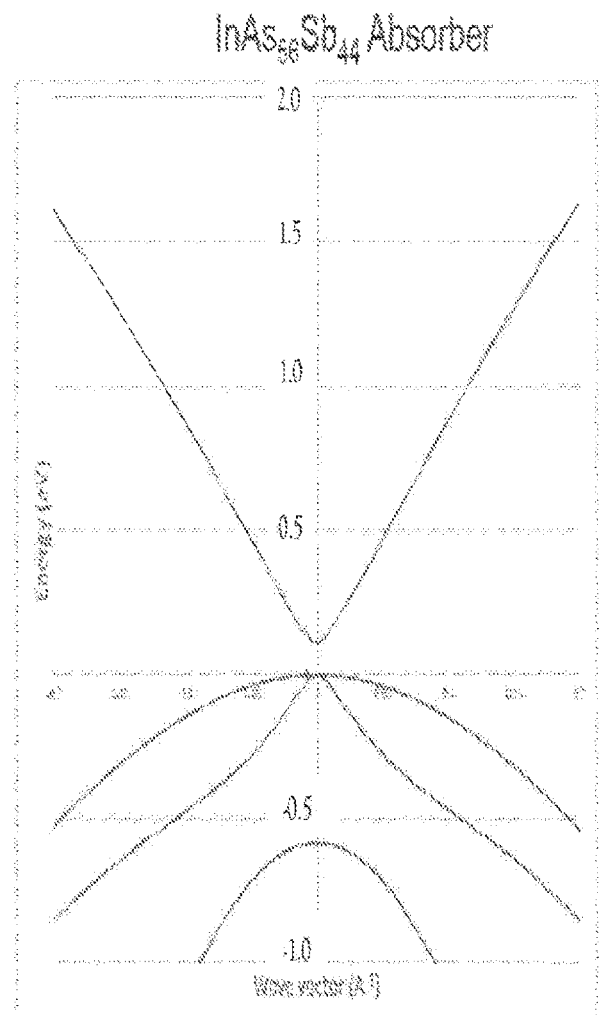
FIG. 10B is a schematic plot of the bandgap energy of the layers of detector of FIG. 10A according to wave vector ranges as set forth herein.
Figure 11A:
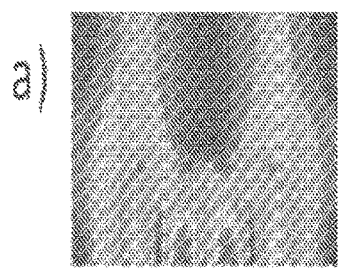
FIG. 11A is a plot of the resonant electric field intensity within and surrounding a cylindrical dielectric resonant antenna as set forth herein.
Figure 11B:
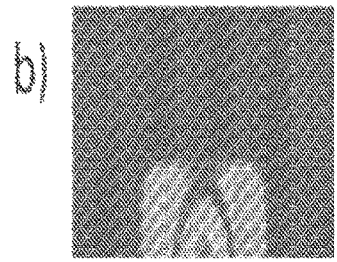
FIG. 11B is a plot of the resonant magnetic field intensity of the induced magnetic dipole inside a dielectric resonant antenna as set forth herein.
Figure 11C:
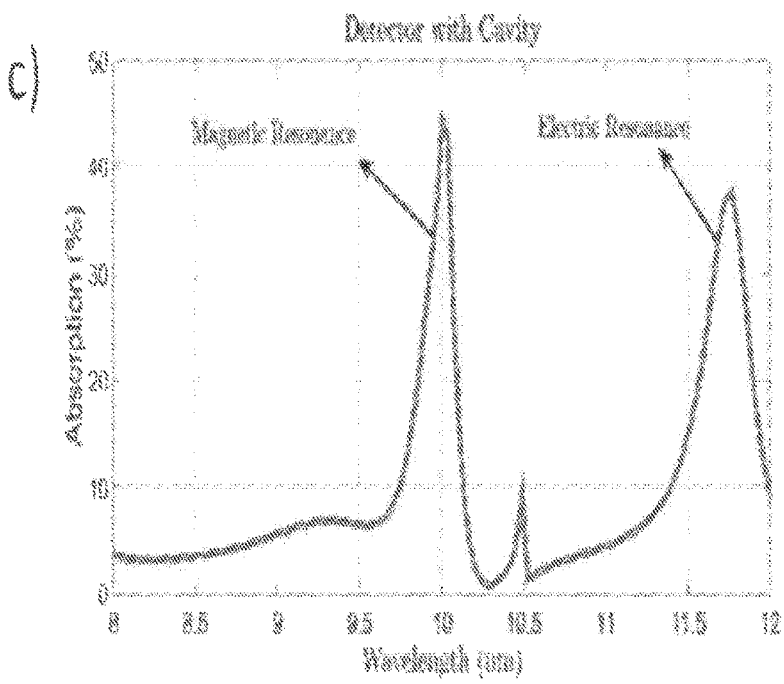
FIG. 11C is a schematic plot of absorption inside the dielectric resonant antenna with a coupled photodetector vs. wavelength. The DRA is designed to resonate at 10 μm. Greater than 40% of the incident power is captured by the detector placed at the peak field position.
Figure 12:
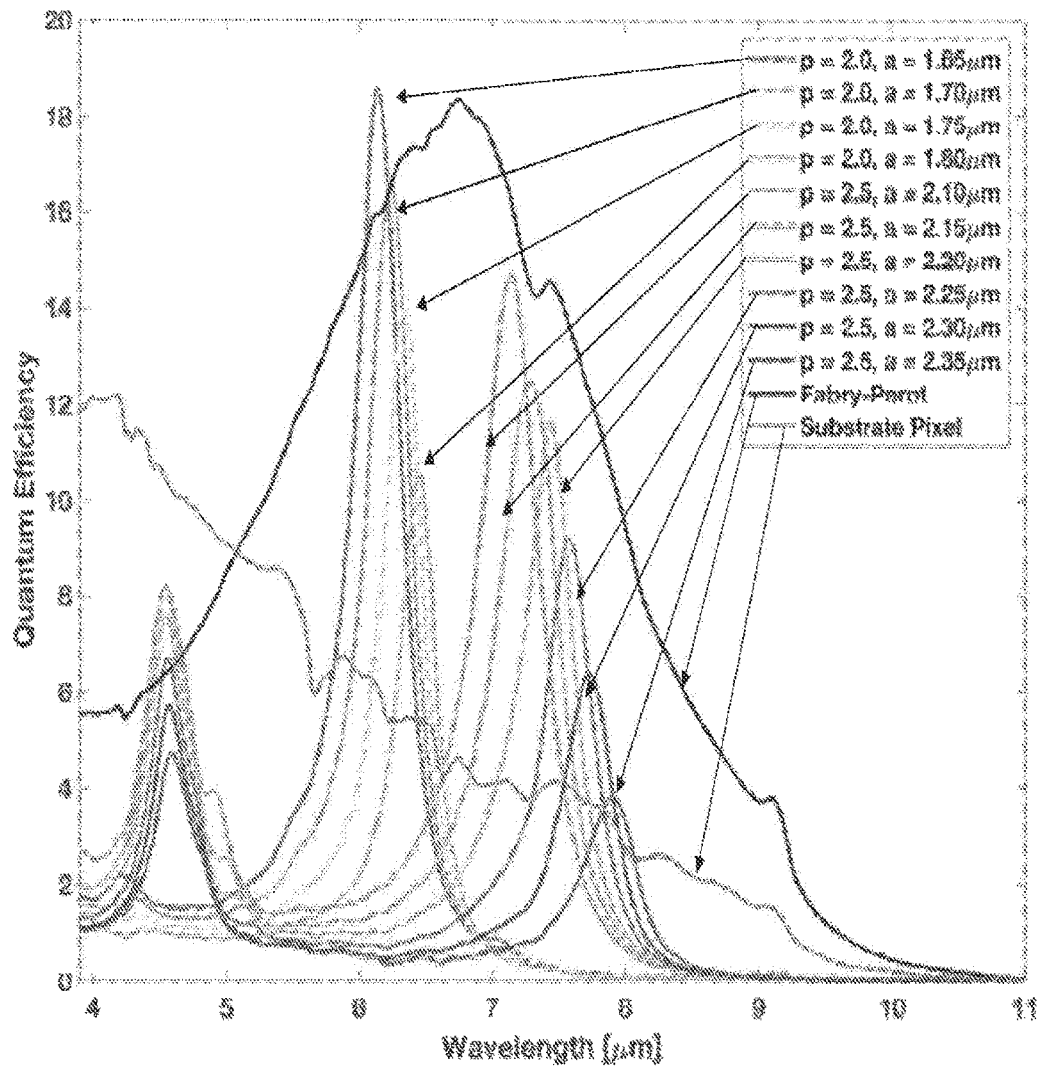
FIG. 12 is a plot of quantum efficiency at a range of wavelengths for a dielectric resonant antenna with a coupled photodetector as set forth herein. The plot illustrates an enhancement factor of 3.4 (18.5 percent as compared with 5.4 percent in single pass device) at λ=6.3 microns and enhancement factor of 3.8 (15.9 percent as compared with 4.1 percent in single pass device) at λ=7.1 microns.
Figure 13:
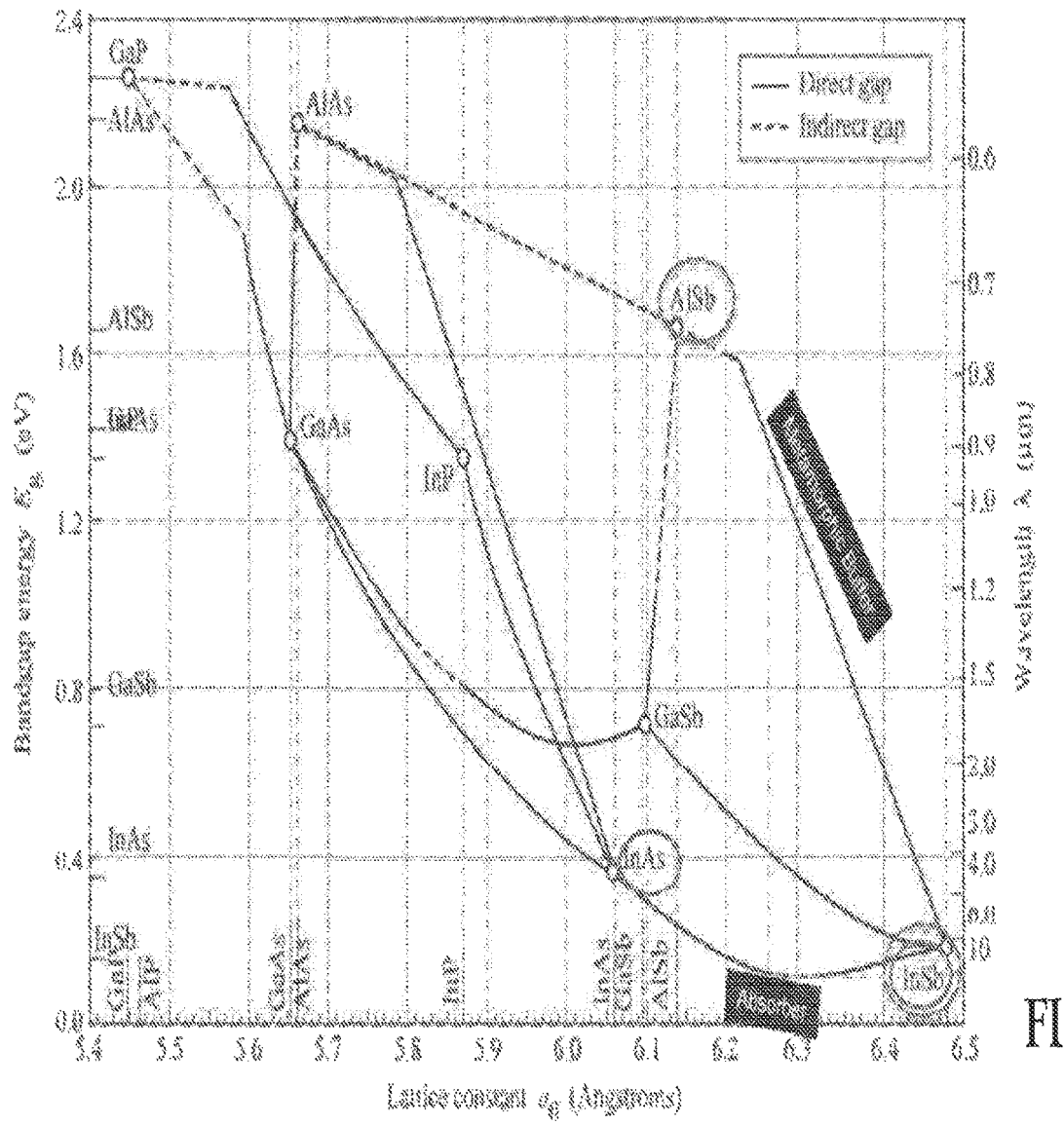
FIG. 13 is a plot of materials of various lattice constant versus bandgap energy for forming the long wave infrared detectors of this disclosure.
Figure 14A:
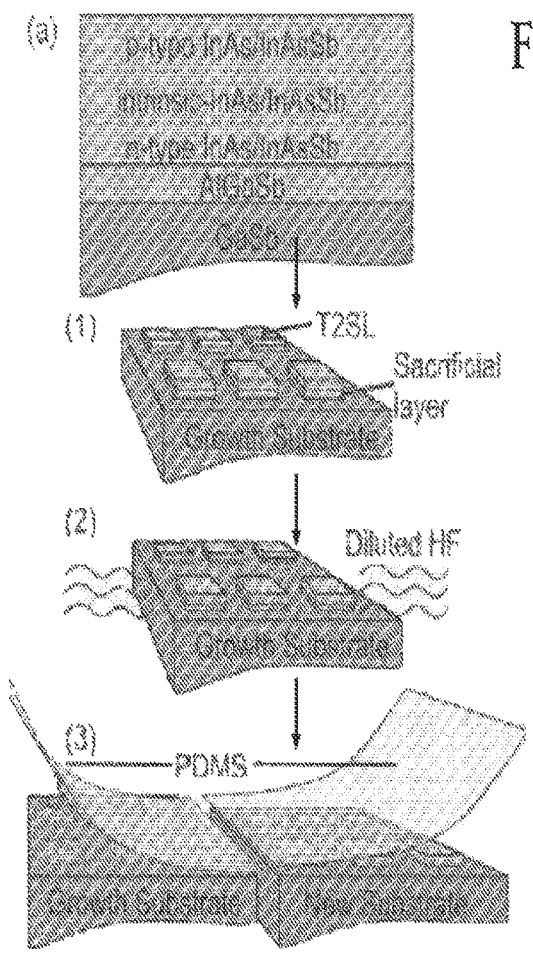
FIG. 14A is a schematic of a series of manufacturing steps for a photonic detector on a substrate as set forth herein, including (a) a dry transfer process for InAs/InAsSb T2SL used: (1) standard photolithography to define pixels and an etch to access the sacrificial layer, (2) sacrificial layer lateral etch in diluted HF, and (3) pixel peel off from the growth substrate and transfer to the new substrate.
Figure 14B:
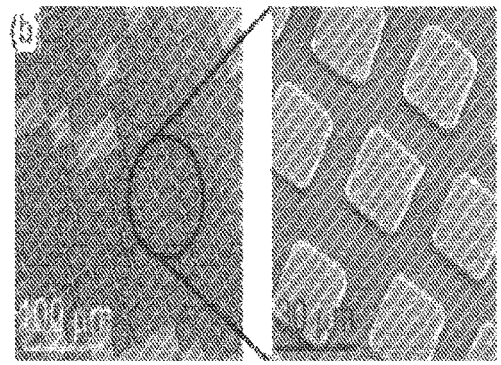
FIG. 14B is a schematic of a series of manufacturing steps for a photonic detector on a substrate as set forth herein including optical microscope and SEM images of transferred pixels.
Figure 14C:
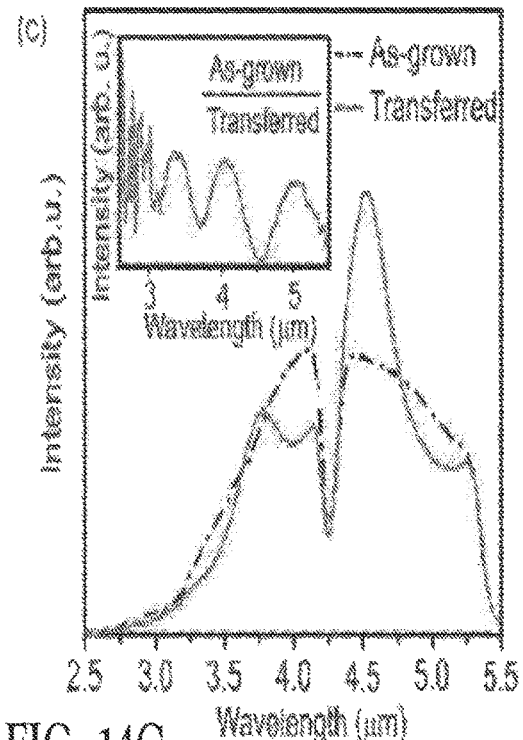
FIG. 14C is a plot of wavelength of incident light schematic of a series of manufacturing steps for a photonic detector on a substrate as set forth herein including a comparison of room-temperature PL spectra between as-grown and transferred membrane detectors [22].
Figure 15A:
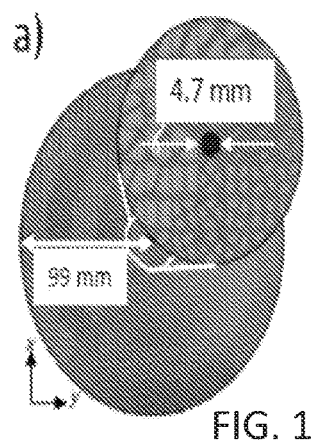
FIG. 15A is a schematic diagram of electromagnetic meta-surfaces including a metallic meta-surface for Bessel beam generation at microwave frequencies [2].
Figure 15B:
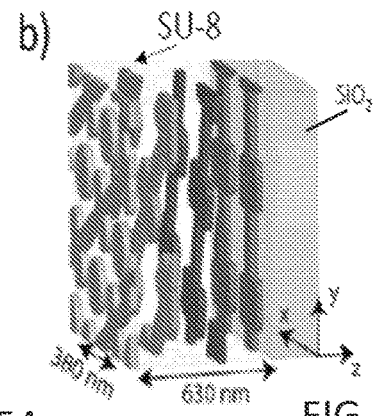
FIG. 15B is a schematic diagram of a plasmonic meta-surface for isotropic polarization rotation [4].
Figure 15C:
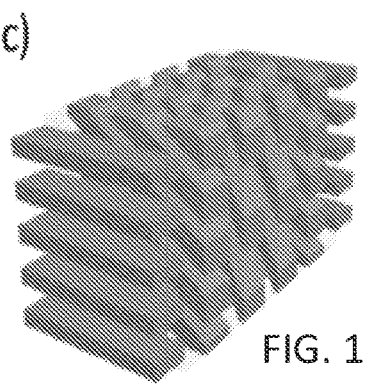
FIG. 15C is a schematic diagram of an all-dielectric meta-surface that acts as an asymmetric circular polarizer [5].
Figure 16A:
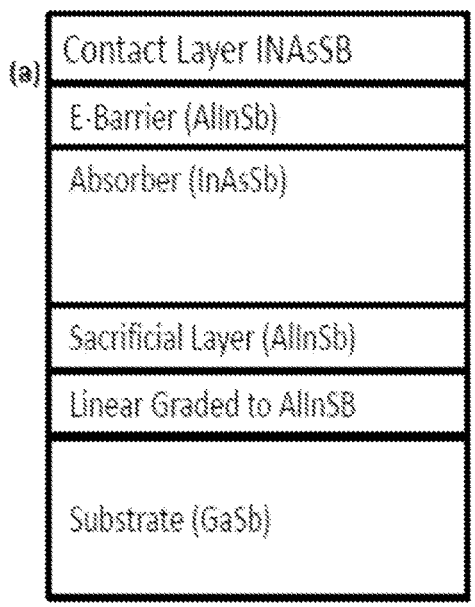
FIG. 16A is a schematic illustration of the proposed long wave infrared "nBn" detector (not to scale).
Figure 16B:
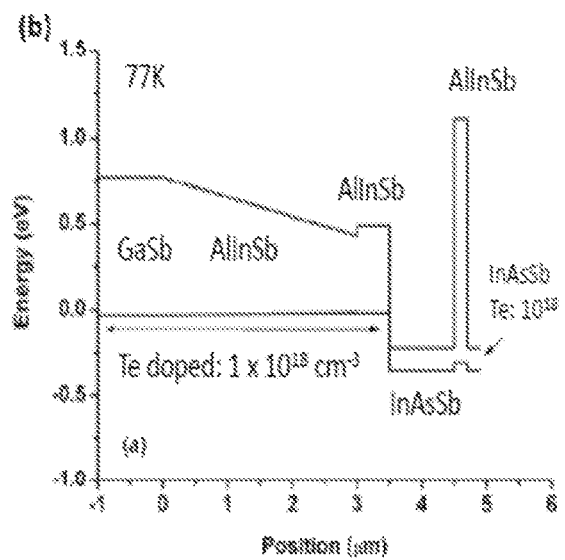
FIG. 16B is the estimated band diagram of the proposed detector of FIG. 16A (based on calculations from [19]).
Figure 17:
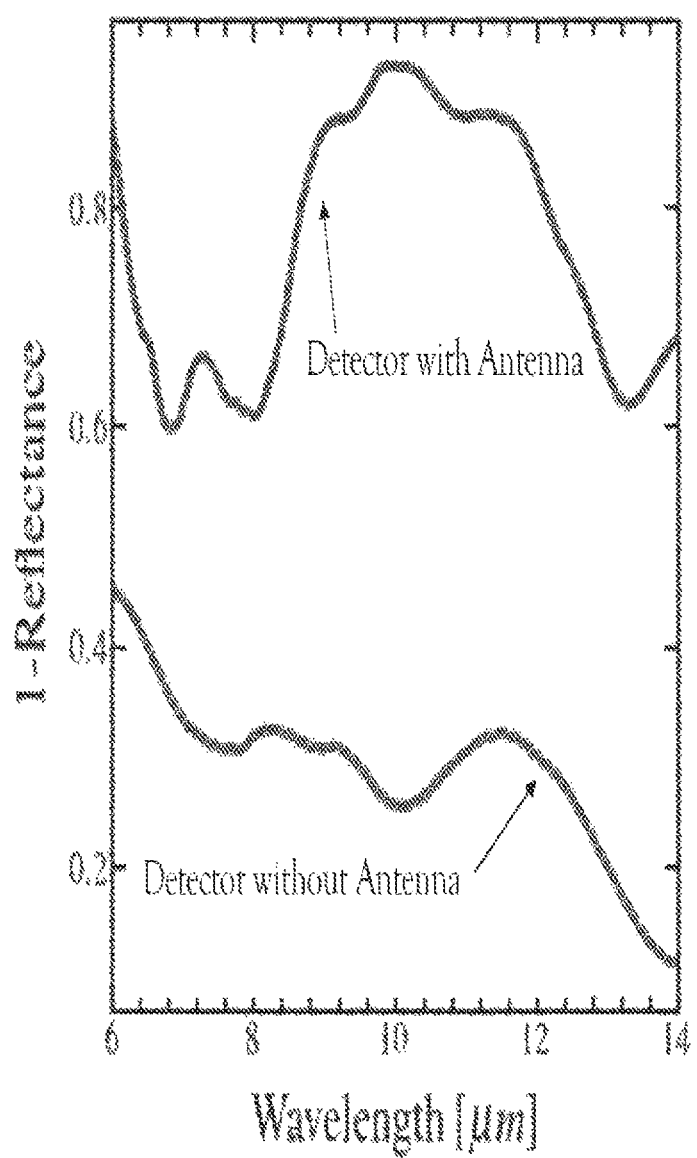
FIG. 17 is a schematic plot of reflectance for a variety of wavelengths of incident light for a detector with no antenna and a detector with a coupled antenna as proposed herein.
Figure 18:
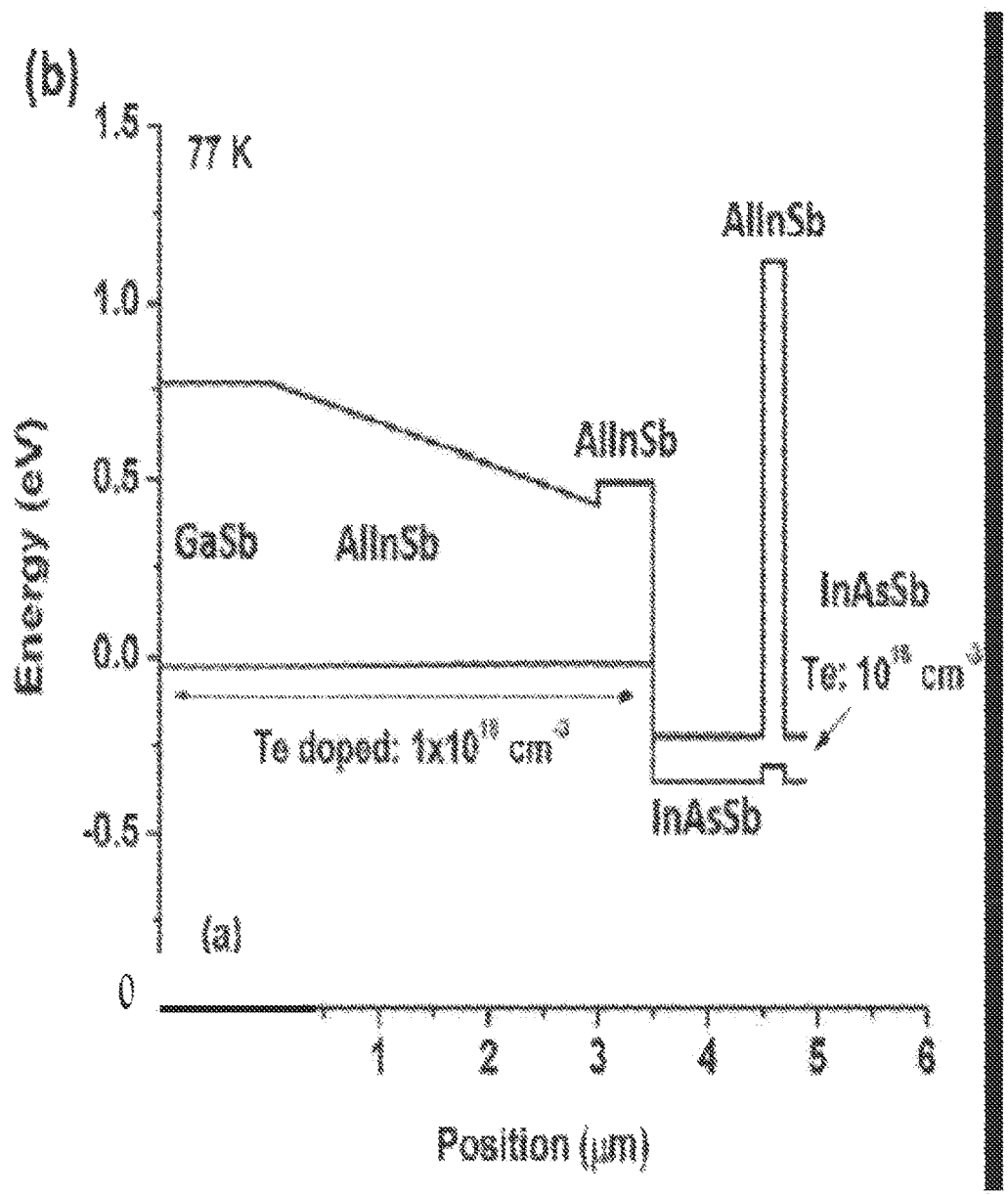
FIG. 18 is a band diagram of a photonic detector as grown by molecular beam epitaxy for the disclosure herein.
Figure 19A:
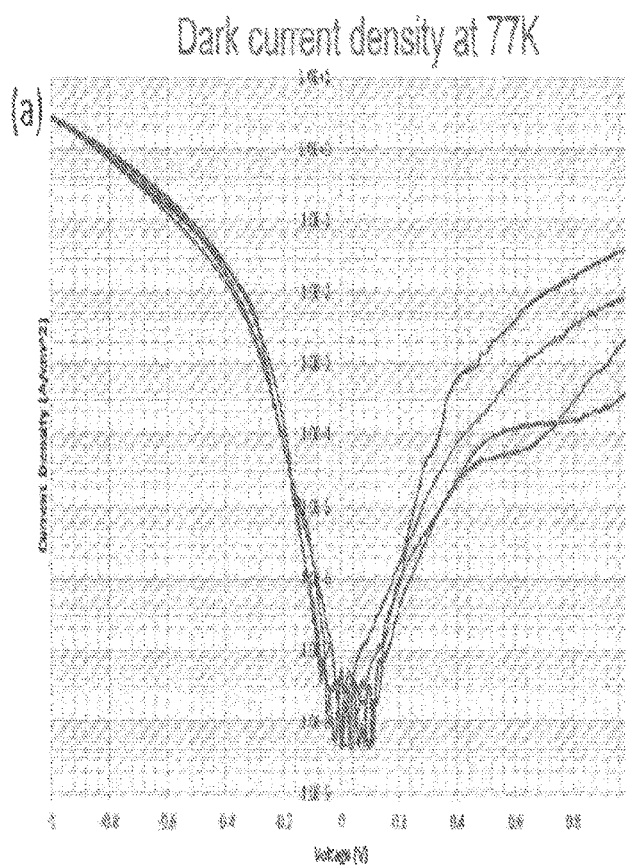
FIG. 19A is a plot of dark current density at 77 degrees Kelvin for devices as disclosed herein.
Figure 19B:
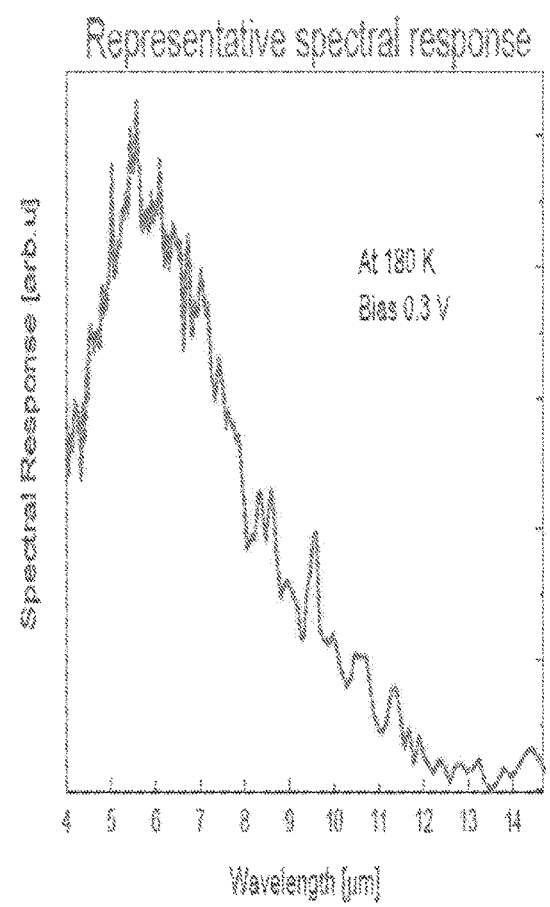
FIG. 19B is a plot of a representative spectral response at a range of wavelengths as detected up to 180 degrees Kelvin for devices as disclosed herein.
Figure 20A:
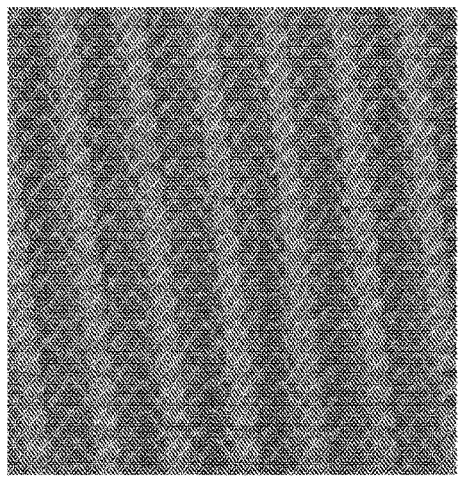
FIG. 20A is an optical microscope view of the long wave infrared detectors with photodetectors coupled to dielectric resonant antennas as described herein.
Figure 20B:
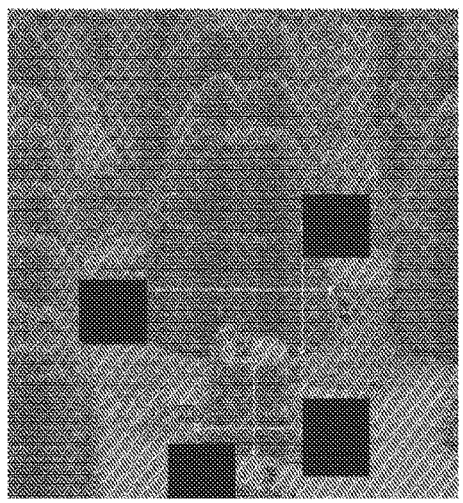
FIG. 20B is a scanning electron microscope view of the long wave infrared detectors with photodetectors coupled to dielectric resonant antennas and singular photo detectors without the dielectric resonant antennas as described herein.
Figure 20C:
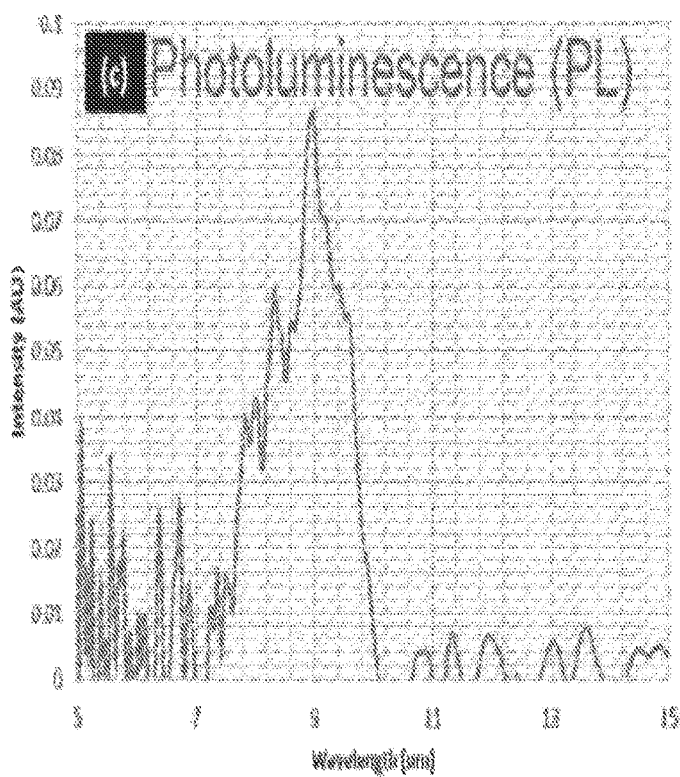
FIG. 20C is a plot of photoluminescence data for the devices disclosed herein and shows intensity for a range of wavelengths. Material characterization suggests a high quality detector photoluminescence peak of 9 μm was found at 77 K.
Figures 21A, 21B:
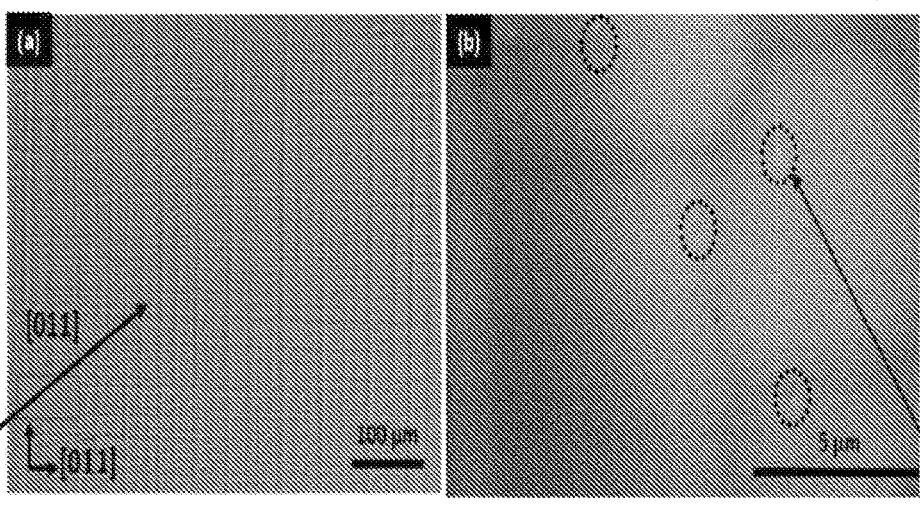
FIG. 21A is an image of material characterization for photo detectors of this disclosure and illustrates a cross hatch pattern that is representative of a good quality metamorphic layer growth for the detector (Normaski method).
FIG. 21B is an image of material characterization for photo detectors of this disclosure and illustrates electron channel contrast imaging (ECCI) for the grown detectors exhibiting threading dislocation density of only $5 \times 10^6$ cm$^{-2}$.
Figure 23:
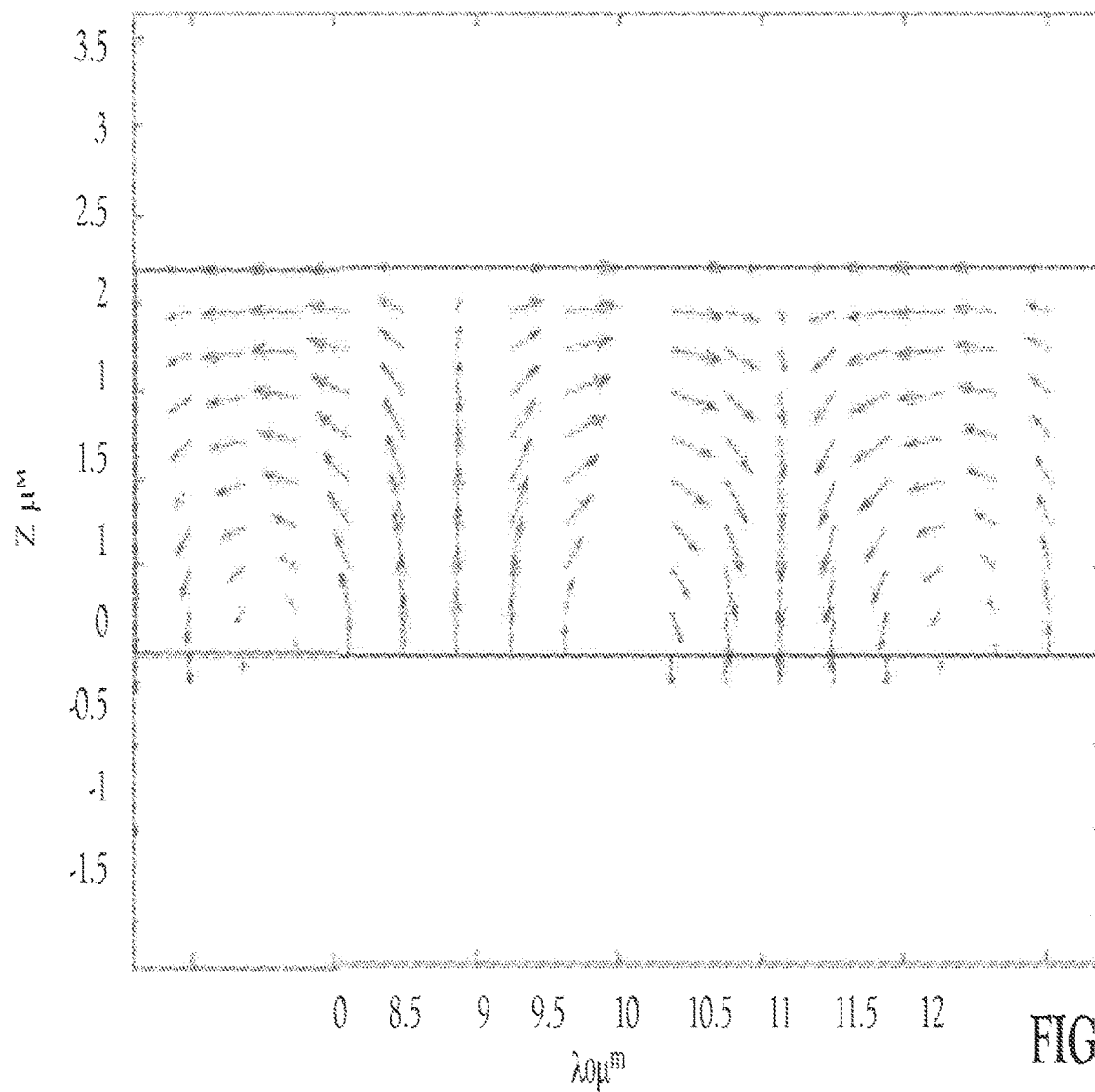
FIG. 23 is a vector field plot of a dielectric resonant antenna operating at TM 120 mode where mode field patterns set up high electric field within the detector due to the solenoidal nature of the modal pattern.
Figure 24A:
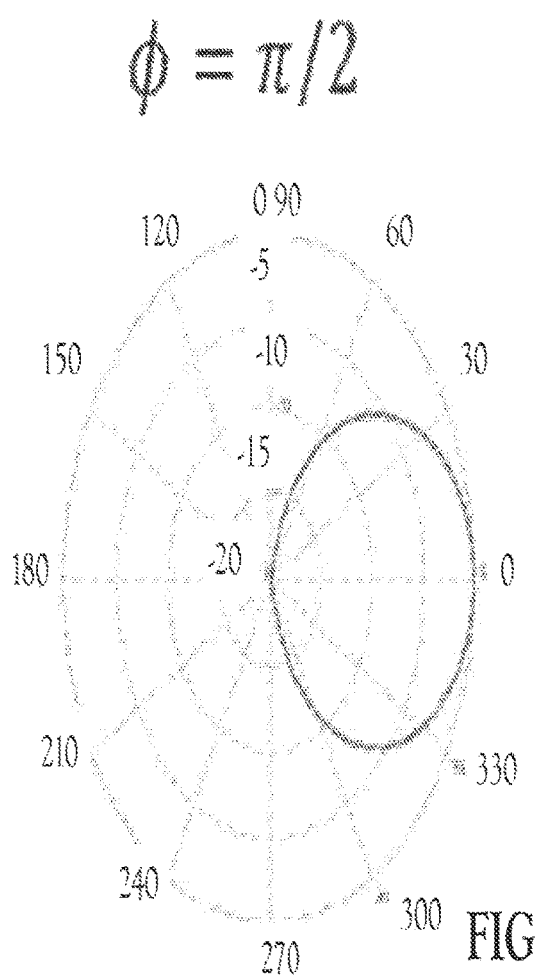
FIG. 24A is an example far field radiation pattern of a dielectric resonant antenna with a phase of λ/2 as disclosed herein.
Figure 24B:
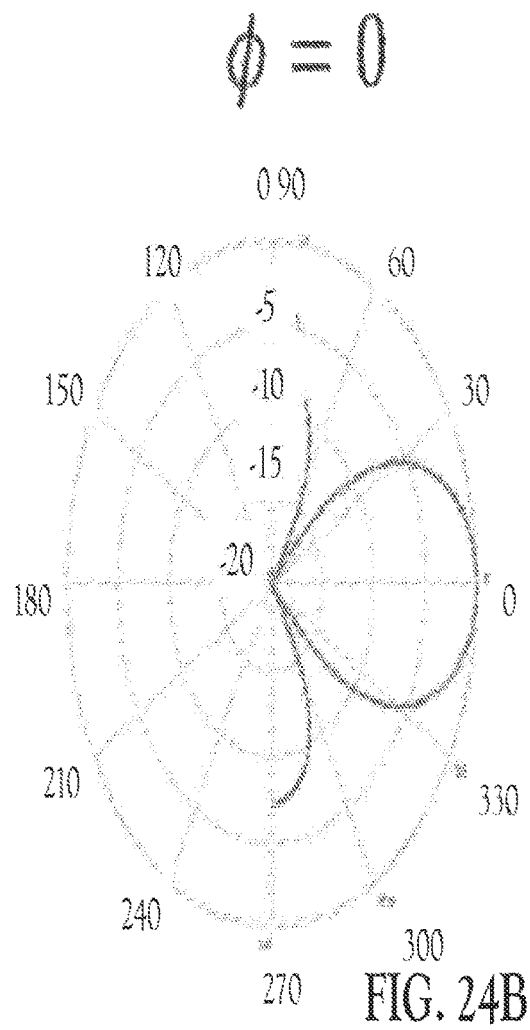
FIG. 24B is an example far field radiation pattern of a dielectric resonant antenna with a phase of 0 as disclosed herein.
Figure 25:
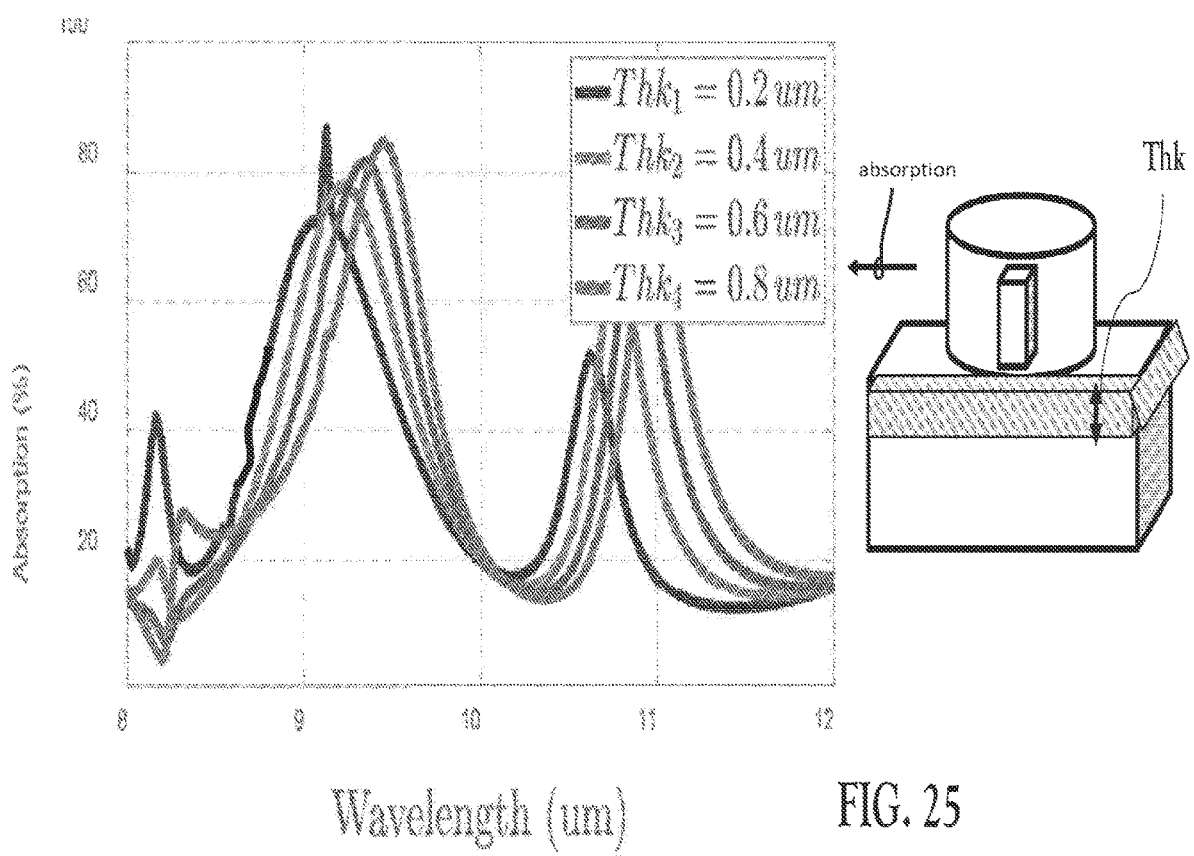
FIG. 25 is a schematic plot of a thickness of a ground plane of a long wave infrared detector of this disclosure varying and exhibiting respective qualities of absorption versus wavelength.
Figure 26A:
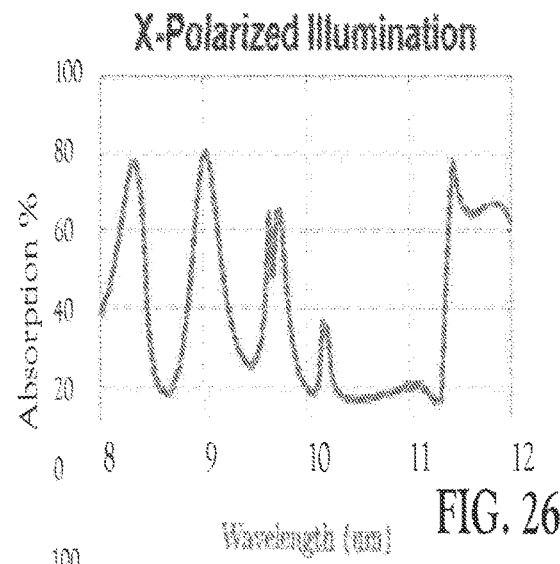
FIG. 26A is a plot of the x-polarized polarization dependency of absorption performance when metal traces are added to the long wave infrared detectors of this disclosure.
Figure 26B:
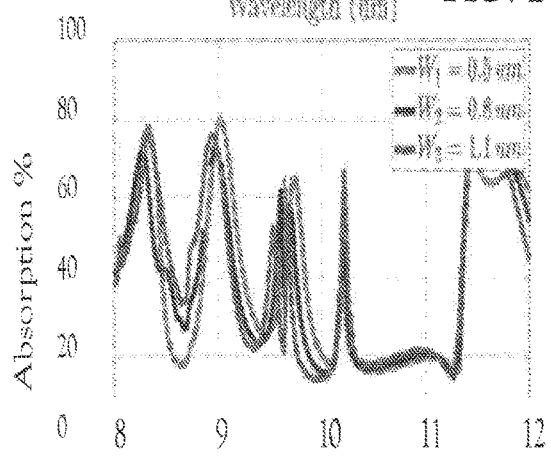
FIG. 26B is a comparative plot of the x-polarized polarization dependency of absorption performance when metal traces are added to the long wave infrared detectors of this disclosure. Three wavelengths are compared as noted.
Figure 26C:
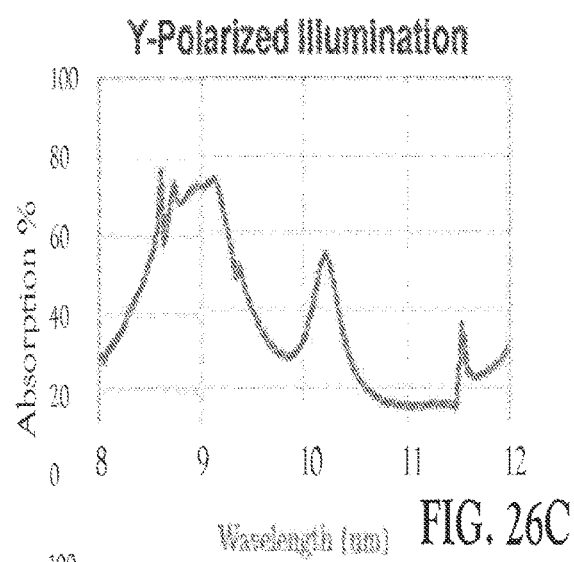
FIG. 26C is a plot of the y-polarized polarization dependency of absorption performance when metal traces are added to the long wave infrared detectors of this disclosure.
Figure 26D:
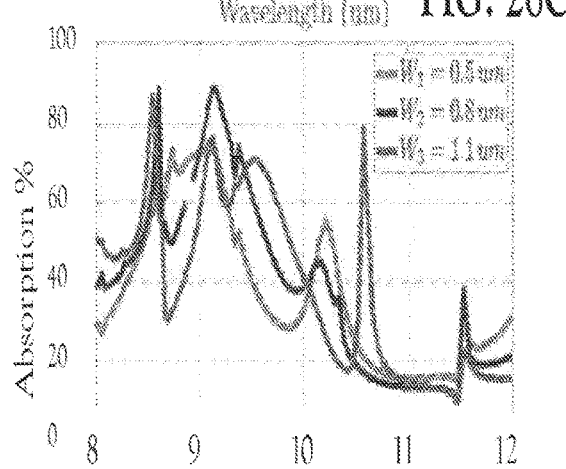
FIG. 26D is a comparative plot of the y-polarized polarization dependency of absorption performance when metal traces are added to the long wave infrared detectors of this disclosure. Three wavelengths are compared as noted.

Epitaxial Lift-Off (ELO) and Membrane Transfer. Following detector growth, the detector will be separated from the GaSb growth substrate, using ELO, and transferred to a gold coated substrate (FIG. 3). Transfer to a gold coated substrate places the detector element and the DRA on a metallic ground plane, ensuring the high dielectric contrast required for efficient coupling of radiation from free space into the DRA. Work described herein has already successfully demonstrated ELO and membrane transfer of III-V infrared light absorbers [21, 22].

The figures schematically illustrate an ELO and dry membrane transfer technique. In this case, the as-grown sample is patterned in an array of 24×24 µm² mesas. A sacrificial layer of AlGaSb between the detector and substrate is partially etched in diluted HF. Then the sample is rinsed in deionized water and dried with nitrogen. Partially released membranes are removed from the growth substrate using either a polydimethylsiloxane (PDMS) stamp or thermal release tape. Dry transfer to the new host is accomplished by a printing process. The figures show the optical microscope and scanning electron microscope (SEM) images of transferred pixels on the new Si substrate. A comparison of room-temperature photoluminescence (PL) spectra between as-grown and transferred membrane detector is also shown. These results verify that the detector retained its optical response characteristics after the transfer.

Surface Passivation. Effective surface passivation is one important aspect in ensuring that Johnson noise (e.g., thermal noise) is the dominant source of noise in the detector element. If, instead, surface effects dominate the noise, then shrinking the detector element will not have the desired benefits. Effective passivation of InAs was recently demonstrated [23] using atomic layer deposition (ALD) of Al2O3. Ongoing research continues to optimize using ALD for passivation of LWIR detectors.

Alternative Approaches Considered. Previous efforts on ACDs used metallic antenna structures. A review of previous infrared ACDs [24] that employed metallic antennas, as well as preliminary modeling, indicate that metallic losses limit the performance of this style of ACD. These issues led to selecting an impedance matched DRA design instead. Several types of III-V semiconductor materials for the LWIR detector have been considered. Previous experience with antimonide-based T2SL detectors [25, 26] provided basic background information, however, previous T2SL detector designs present two significant problems. First, there are fundamental challenges associated with low vertical mobility of holes and large in-plane carrier diffusion in n-type LWIR T2SL absorbers. Even though p-type T2SL absorbers have been proposed to mitigate these challenges, those suffer from large surface leakage currents. Second, surface passivation is a major challenge for T2SL detectors. Effective surface passivation is one important aspect to the disclosed work because the surface area to volume ratio is larger than typical detectors. Taking these challenges into account, this disclosure proposes to use an InAsSb nBn detector element [19]. This structure provides a more reliable path to meet this project's needs and focus our efforts on the DRA integration.

Supporting Background, Data and Modeling. The DRA modeling needed for this effort is supported by previous, successful meta-surface modeling and implementation efforts [1-4], several of which are illustrated in the figures accompanying this disclosure. The capability to fabricate and transfer the detector are supported by certain previous efforts with T2SL and other antimonide based detectors [25, 26]. This work includes a demonstration of the ability to detect across the LWIR with an InAsSb structure by increasing the Sb fraction. Specific to the DRACAD, this disclosure has modeled the preliminary design shown in FIGS. 2A-2D. In preliminary work, the antimonide detector element is modelled as a dielectric block (1 µm cube) of refractive index equal to 3.5 and loss tangent equal to 0.09113, corresponding to an absorption coefficient of $\alpha$=2000 cm−1 [27]. The DRAs are assumed to be made of $\alpha$-Si with a relative permittivity of 11.7 and a loss tangent of $1\times10^{-4}$. Preliminary simulations compare an array of detector elements, alone, to an array of DRACAD. The detectors alone, spaced with 10 µm periodicity, have an external quantum efficiency (EQE) of 0.15% for 10 µm radiation. The preliminary DRACAD increases the EQE to above 40% over a 5% fractional bandwidth.

Expected Improvements. Both state-of-the-art MCT detectors and previous LWIR ACD efforts will be improved upon with the LWIR detector assemblies of this disclosure. Table 1 compares key detector characteristics.

TABLE 1

Expected improvements of the DRACAD LWIR relative to MCTs and previous ACDs.

| | MCT [28] | Previous ACD [29] | DRACAD Targets |
|---|---|---|---|
| Detectivity (D*)/Jones | $10^7$ bare<br>$10^8$ bare | $10^5$ | $>10^9$ |
| Operating Temperature | 300 K | 300 K | >250 K |
| Detector Bandwidth | Full Band | Tunable with antenna design, broadband or narrow | Tunable with DRA design, broadband or narrow |
| Spectral Coverage | 8-11 microns | 8-12 microns | 8-12 microns |
| Compatible with Focal Plane Array (FPA) | No, due to large dimensions of the microlenses | Yes | Yes |

Task Descriptions

The proposed program is organized into six tasks. Several of these tasks interact closely with one another, and the results from earlier tasks will feed into later ones.

Task 1, Resonator Design. This disclosure illustrates detailed simulations of the DRA geometries coupled to photonic detector elements. In contrast to conventional DRA designs, the antenna will not be matched to 50 ohms, but rather directly impedance matched to the photonic detector element. We will model the detectors using their index of refraction and absorption coefficient extracted from ellipsometry measurements of fabricated antimonide layers. In addition, the metallic/doped contacts of the detector elements will be included in the electromagnetic simulations to account for their effects on the DRACAD performance Design techniques from the microwave regime will be applied to broaden the bandwidth of the DRA and cover the LWIR band (8-12 µm). Bandwidth enhancing techniques will be investigated such as multimode operation (where modes with similar radiation patterns are merged together), stacked resonator geometries (coupled resonators), shape optimization, and hybrid designs with metallic geometries coupled to dielectric resonators [30, 31].

Task 2, Resonator Fabrication. Many of the DRA and photon detectors employ the Ohio State NanoTech West facilities to deposit α-Si using CVD and pattern the α-Si into DRAs [32]. Tools have been used to characterize the DRAs' optical characteristics using ellipsometry and spectrally resolved reflectance measurements as shown in the figures of this disclosure. These measurements will determine the permittivity of the DRAs. The results will be used to iteratively improve the design and fabrication processes. Several DRA designs will be produced in order to contrast them with one another and select a design(s) for the DRA-CADs.

Task 3, Detector Design & Growth. A heterostructure modified from the experimentally verified design of [19] to produce a nBn detector includes a layer sequence and estimated band diagram of the proposed barrier photodetector. Lattice matching between the GaSb substrate and the Al0.4In0.6Sb sacrificial layer is addressed by linearly grading the fraction of In from 0% to 44%. The sacrificial layer is included to support the epitaxial lift-off performed in Task 4. The 1.0 µm layer of InAs0.6Sb0.4 is the absorber, the 20 nm Al0.75In0.25Sb above it is the barrier, and the 20 nm InAs0.6Sb0.4 on top is a contact layer. The buffer, sacrificial layer, and top contact layer are Te-doped to a level of 1018 cm−3. The AlInSb barrier is undoped. The effective bandgap for this structure is estimated to be 15 meV (8.2 µm). Epitaxial growth of InAsSb with an Sb fraction of up to 60% has proven effective in one non-limiting embodiment. In one non-limiting example, the heterostructure may be grown by solid-source antimonide molecular beam epitaxy reactor (AMBER) on GaSb substrates utilizing valved crackers for As and Sb. The Sb incorporation will be adjusted by changing the relative pressures of As and Sb. The grown material will be characterized as indicated in Table 2. A portion of the material will be converted to detectors in order to measure those characteristics.

TABLE 2

Material and detector characterization measurements.
Detector characterization measurements will be made
at temperatures between 77 K and room temperature.

| | Technique | As Grown | Transferred | DRACAD |
|---|---|---|---|---|
| Material | XRD | X | X | |
| Material | PL | X | X | |
| Material | ELLIPSOMETRY | X | X | |
| Detector | EQE | X | X | X |
| Detector | DARK CURRENT | X | X | X |

Task 4, Detector Transfer. The detector elements are separated from the GaSb substrate using the epitaxial lift off (ELO) and membrane transfer technique previously demonstrated by the Krishna group [21, 22]. The separated detectors will be transferred to a gold coated substrate, passivated using ALD and metallized in order to have the needed electrical contacts. The majority of the transferred detectors will be used in Task 5. The transferred detectors will be characterized as indicated in Table 2.

Task 5, DRACAD Integration. Fabricating DRAs on top of (and surrounding) the transferred photon detector elements produce DRACADs. In one non-limiting embodiment, this disclosure will follow the DRA fabrication technique developed in Task 2. The DRACADs will be characterized as indicated in Table 2.

Task 6, DRACAD Assessment. Design and experimental data, shown in the figures, quantify the performance characteristics of the DRACAD and other embodiments of this disclosure. In many examples, the predicted or simulated results are compared to measured values.

Technical Risk

The approach of this disclosure mitigates the high technical risk issues identified below.

Noise at Room Temperature. Infrared detectors are typically operated at cryogenic temperatures in order to suppress Johnson noise. The embodiments of this disclosure will enable room temperature operation by shrinking the volume of the antimonide detector element. Johnson noise is proportional to the number of carriers, and therefore scales with the volume of the detector. The small size of the proposed antimonide detector will limit Johnson noise, and the DRACAD will achieve the target signal-to-noise at room temperature.

Surface Passivation. To ensure that Johnson noise is the dominant source of noise, this disclosure encompasses steps to passivate the photon detector elements using ALD of Al2O3. This approach was recently demonstrated [23] to be more effective than either sulfur or nitride passivation 185 for an InAs heterostructure.

Detector Transfer. The coupling of the DRA and the detector requires the growth of the DRA directly on top of (and surrounding) a fabricated detector, all on a metallized surface. The ELO and membrane transfer technique demonstrated by the Krishna group [21, 22] enables the separation of the grown material from its GaSb substrate and attachment to a gold coated substrate.

Confirmation of DRA Modeling. The reliability of the DRA modeling has been established in previous metasurface design and implementation efforts. In addition to these previous efforts, the disclosure uses this effort to include an initial, iterative stage of design and fabrication of the DRA to validate the modeling predictions. These stages, Tasks 1 and 2, will be completed and validated to serve as input to the DRACAD integration, Task 5.

Spectral Bandwidth. Incorporating a DRA structure into the detector may place an inherent limit on the bandwidth of the DRACAD that does not address the needs for an LWIR sensor or FPA. This disclosure encompasses DRAs with different spectral bandwidths and different band centers. The possible geometries may be limited by fabrication capabilities, so multiple bandwidth expansion techniques will be explored. Prior works on DRAs at microwave frequencies have demonstrated bandwidths from 25% to nearly 80% [30, 31]. In addition, since a narrow bandwidth is expected to have noise benefits, the data needed for a tradeoff study between expanding the bandwidth and limiting the spectral range will be obtained. If a limited spectral range is beneficial to meet signal-to-noise targets, then a DRACAD FPA could make use of "super pixels" of multiple DRACAD detectors grouped together to provide the required spectral coverage.

Embodiments of the LWIR detector may be expressed as follows:

An apparatus 100 for light detection includes a detector assembly 150 and a dielectric resonator layer 160 coupled to the detector assembly and configured to receive transmission of incident light that is directed into the detector assembly 150 by the dielectric resonator layer 160, wherein the dielectric resonator layer resonates with a range of wavelengths of the incident light. In some embodiments, a ground plane 175 supports the dielectric resonator layer and the detector assembly. The ground plane 175 may be a conductive ground plane, such as but not limited to a metallic ground plane or a doped semiconductor substrate. In one sense, the detector assembly and the dielectric resonator layer are coupled physically and through electric fields. In the Dielectric Resonator Antenna Coupled Antimonide Photodetector (DRACAD), the dielectric resonator antenna (DRA) surrounds, or is in close proximity to, the detector. The DRA forms a resonant cavity that supports a mode, or modes, with the detector acting as a load. The detector is tuned to absorb photons at a particular wavelength of interest. Dimensions of the DRA and detector are chosen to impedance match the incident radiation to the detector through the DRA, thereby maximizing absorption. The photon detector assembly comprises at least one dimension of diameter, height, width, and length that is smaller than the wavelength of the incident light transmission. The dielectric resonator layer may be a block comprising at least one dielectric or semiconductor material. The dielectric or semiconductor material is transparent to the incident light, such as but not limited to infrared light. The dielectric or semiconductor material may be amorphous (α-) silicon. The dielectric resonator layer may be, in one non-limiting example, a cylindrical or rectangular structure of α-silicon. Generally, the photon detector assembly includes layers of a Group III-V semiconductor material. One example shown in the figures is a detector assembly having a structure of InAsSb as the Group III-V semiconductor material. In that embodiment, the Sb content of the detector assembly corresponds to the wavelength of the incident light transmission. A passivation layer 185 may extend over at least a portion of the detector assembly. In one embodiment, the passivation layer includes an atomic layer deposition of $Al_2O_3$. Overall, an LWIR detector 100, or any light detector using the concepts of this disclosure, may include a top contact 190 on the detector assembly and a conductive ground plane 175 supporting the apparatus as a bottom contact 195. The apparatus for light detection may be configured for operation in an array of pixels. These and other features of this disclosure are set forth in the claims below.

REFERENCES

[1] C. Pfeiffer and A. Grbic, "Metamaterial Huygens' surfaces: tailoring wave fronts with reflection-less sheets," Phys Rev Lett, vol. 110, no. 19, p. 197401, May 10 2013.
[2] C. Pfeiffer and A. Grbic, "Controlling Vector Bessel Beams with Meta-surfaces," Physical Review Applied, vol. 2, no. 4, p. 044012, Oct. 23 2014.
[3] C. Pfeiffer and A. Grbic, "Planar Lens Antennas of Subwavelength Thickness: Collimating Leaky-Waves With Meta-surfaces," IEEE Transactions on Antennas and Propagation, vol. 63, no. 7, pp. 3248-3253, July 2015.
[4] C. Pfeiffer, C. Zhang, V. Ray, L. Jay Guo, and A. Grbic, "Polarization rotation with ultrathin bi-anisotropic meta-surfaces," Optica, vol. 3, no. 4, pp. 427-432, 2016/04/20 2016.
[5] M. Ranjbar and A. Grbic, "All-dielectric bi-anisotropic meta-surfaces," in IEEE International Symposium on Antennas and Propagation, San Diego, Calif., 2017.
[6] A. Arbabi, Y. Horie, M. Bagheri, and A. Faraon, "Dielectric meta-surfaces for complete control of phase and polarization with subwavelength spatial resolution and high transmission," arXiv preprint arXiv:1411.1494, 2014.
[7] M. Decker et al., "High-Efficiency Dielectric Huygens' Surfaces," Advanced Optical Materials, vol. 3, no. 6, pp. 813-820, June 2015.
[8] P. Moitra, Y. Yang, Z. Anderson, I. I. Kravchenko, D. P. Briggs, and J. Valentine, "Realization of an all-dielectric zero-index optical metamaterial," Nature Photonics, vol. 7, no. 10, pp. 791-795, 10//print 2013.
[9] C. Wu et al., "Silicon-based infrared metamaterials with ultra-sharp fano resonances," arXiv preprint arXiv: 1309.6616, 2013.
[10] Y. Abdulraheem, I. Gordon, T. Bearda, H. Meddeb, and J. Poortmans, "Optical bandgap of ultra-thin amorphous silicon films deposited on crystalline silicon by PECVD," AIP Advances, vol. 4, no. 5, p. 057122, 2014.
[11] J. Löffler, R. Groenen, J. Linden, M. Van de Sanden, and R. Schropp, "Amorphous silicon solar cells on natively textured ZnO grown by PECVD," Thin Solid Films, vol. 392, no. 2, pp. 315-319, 2001.
[12] M. K. Hatalis and D. W. Greve, "Large grain polycrystalline silicon by low-temperature annealing of low-pressure chemical vapor deposited amorphous silicon films," Journal of Applied Physics, vol. 63, no. 7, pp. 2260-2266, 1988.
[13] K. Feenstra, R. Schropp, and W. Van der Weg, "Deposition of amorphous silicon films by hot-wire chemical vapor deposition," Journal of Applied Physics, vol. 85, no. 9, pp. 6843-6852, 1999.
[14] A. Arbabi, Y. Horie, M. Bagheri, and A. Faraon, "Dielectric meta-surfaces for complete control of phase and polarization with subwavelength spatial resolution and high transmission," Nature Nanotechnology, Letter vol. 10, no. 11, pp. 937-43, November 2015.
[15] L. Dawson, "Molecular beam epitaxial growth of InAsSb alloys and superlattices," Journal of Vacuum Science & Technology B, vol. 4, no. 2, pp. 598-599, 1986.
[16] M. Yen, B. Levine, C. Bethea, K. Choi, and A. Cho, "Molecular beam epitaxial growth and optical properties of InAs1-x Sb x in 8-12 μm wavelength range," Applied Physics Letters, vol. 50, no. 14, pp. 927-929, 1987.

[17] Y. Lin et al., "Development of bulk InAsSb alloys and barrier heterostructures for longwave infrared detectors," Journal of Electronic Materials, vol. 44, no. 10, pp. 3360-3366, 2015.

[18] Y. Lin et al., "Transport properties of holes in bulk InAsSb and performance of barrier long-wavelength infrared detectors," Semiconductor Science and Technology, vol. 29, no. 11, p. 112002, 2014.

[19] D. Wang et al., "Metamorphic InAsSb-based barrier photodetectors for the long wave infrared region," Applied Physics Letters, vol. 103, no. 5, p. 051120, 2013/07/29 2013.

[20] Y. Yang, I. I. Kravchenko, D. Briggs, and J. Valentine, "Dielectric meta-surface analogue of electromagnetically induced transparency," in CLEO: QELS_Fundamental Science, 2015, p. FW4C. 7: Optical Society of America.

[21] M Zamiri et al., "Antimonide-based membranes synthesis integration and strain engineering," Proceedings of the National Academy of Sciences, p. 201615645, 2016.

[22] M. Zamiri et al., "Indium-bump-free antimonide superlattice membrane detectors on silicon substrates," Applied Physics Letters, vol. 108, no. 9, p. 091110, 2016.

[23] C. Mittag et al., "Passivation of Edge States in Etched InAs Sidewalls," arXiv preprint arXiv:1706.01704, 2017.

[24] H. Kazemi et al., "First THz and IR characterization of nanometer-scaled antenna-coupled InGaAs/InP Schottky-diode detectors for room temperature infrared imaging—art. no. 65421J," Infrared Technology and Applications XXXIII, vol. 6542, pp. J5421-J5421, 2007.

[25] A. P. Craig, M. D. Thompson, Z. B. Tian, S. Krishna, A. Krier, and A. R. J. Marshall, "InAsSb-based nBn photodetectors: lattice mismatched growth on GaAs and low-frequency noise performance," Semiconductor Science and Technology, vol. 30, no. 10, p. 105011, October 2015.

[26] A. P. Craig, A. R. J. Marshall, Z. B. Tian, and S. Krishna, "Mid-infrared InAsSb-based nBn photodetectors with AlGaAsSb barrier layers—Grown on GaAs, using an interfacial misfit array, and on native GaSb," Infrared Physics & Technology, vol. 67, pp. 210-213, November 2014.

[27] Z. B. Tian, R. T. Hinkey, S. Krishna, and E. A. Plis, "Influence of composition in InAs/GaSb type-II superlattices on their optical properties," Electronics Letters, vol. 50, no. 23, pp. 1733-1734, Nov. 6 2014.

[28] (2017, Sep. 9, 2017). VIGO MCT Infrared Detector Description & Specifications. Available: https://www.vigo.com.pl/products/infrared-detectors [29] J. A. Bean, A. Weeks, and G. D. Boreman, "Performance Optimization of Antenna-Coupled Al/AlOx/PtTunnel Diode Infrared Detectors," IEEE Journal of Quantum Electronics, vol. 47, no. 1, pp. 126-135, January 2011.

[30] L. Kwok Wa, L. Eng Hock, and F. Xiao Sheng, "Dielectric Resonator Antennas: From the Basic to the Aesthetic," Proceedings of the IEEE, vol. 100, no. 7, pp. 2181-2193, 2012.

[31] A. Petosa and A. Ittipiboon, "Dielectric resonator antennas: A historical review and the current state of the art," IEEE Antennas and Propagation Magazine, vol. 52, no. 5, pp. 91-116, 2010.

[32] W. Q. Wu, H. L. Feng, H. S. Rao, Y. F. Xu, D. B. Kuang, and C. Y. Su, "Maximizing omnidirectional light harvesting in metal oxide hyperbranched array architectures," Nature Communications, vol. 5, p. 3968, May 29 2014.

The invention claimed is:

1. An apparatus for light detection comprising:
a detector assembly, wherein the detector assembly is bulk diffusion limited;
a dielectric resonator layer coupled to the detector assembly and configured to receive transmission of incident light that is directed into the detector assembly by the dielectric resonator,
wherein the dielectric resonator layer resonates with a range of wavelengths of the incident light;
a ground plane connected to the detector assembly and supporting the dielectric resonator layer and the detector assembly;
a passivation layer between the detector assembly and the dielectric resonator layer.

2. The apparatus of claim 1, wherein the ground plane is a conductive ground plane.

3. The apparatus of claim 1, wherein the detector assembly and the dielectric resonator layer are coupled through electric fields.

4. The apparatus according to claim 1, wherein the detector assembly comprises at least one dimension of diameter, height, width, and length that is smaller than the wavelength of the incident light transmission.

5. The apparatus according to claim 1, wherein the dielectric resonator layer is a block comprising at least one dielectric or semiconductor material.

6. The apparatus according to claim 5, wherein the dielectric or semiconductor material is transparent to the incident light.

7. The apparatus according to claim 5, wherein the dielectric or semiconductor material is amorphous (α-) silicon.

8. The apparatus according to claim 7, wherein the dielectric resonator layer is a cylindrical or rectangular structure of a silicon.

9. The apparatus according to claim 1, wherein the detector assembly comprises a Group III-V semiconductor material.

10. The apparatus according to claim 9, wherein the detector assembly comprises a structure of InAsSb as the Group III-V semiconductor material.

11. The apparatus according to claim 10, wherein the Sb content of the detector assembly corresponds to the wavelength of the incident light transmission.

12. The apparatus according to claim 1, wherein the passivation layer comprises an atomic layer deposition of $Al_2O_3$.

13. The apparatus according to claim 1, further comprising a top contact on the detector assembly and a conductive ground plane supporting the apparatus further comprises a bottom contact.

14. The apparatus according to claim 1, wherein the dielectric resonator layer provides impedance matching with the incident light transmission.

15. The apparatus according to claim 1, wherein the dielectric resonator layer comprises layers of dielectric meta-surfaces comprising patterned regions thereon.

16. The apparatus according to claim 1, wherein the detector assembly comprises a surface area that is less than or equal to a comparable surface area of the dielectric resonator layer.

17. The apparatus according to claim 1, wherein the apparatus for light detection is configured for operation in an array of pixels.

* * * * *